(12) United States Patent
Okamoto

(10) Patent No.: US 9,437,672 B2
(45) Date of Patent: Sep. 6, 2016

(54) SEMICONDUCTOR DEVICE

(71) Applicant: FUJITSU LIMITED, Kawasaki-shi, Kanagawa (JP)

(72) Inventor: Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/056,351

(22) Filed: Oct. 17, 2013

(65) Prior Publication Data
US 2014/0209893 A1 Jul. 31, 2014

(30) Foreign Application Priority Data
Jan. 29, 2013 (JP) ................................ 2013-014553

(51) Int. Cl.
*H01L 29/04* (2006.01)
*H01L 29/417* (2006.01)
*H01L 29/66* (2006.01)
*H01L 29/778* (2006.01)
H01L 29/20 (2006.01)

(52) U.S. Cl.
CPC ......... *H01L 29/045* (2013.01); *H01L 29/4175* (2013.01); *H01L 29/66462* (2013.01); *H01L 29/7787* (2013.01); H01L 29/2003 (2013.01); H01L 2924/0002 (2013.01)

(58) Field of Classification Search
CPC ... H01L 21/00; H01L 21/335; H01L 21/338; H01L 27/1225; H01L 29/04; H01L 29/778; H01L 29/7869; H01L 29/66969
See application file for complete search history.

(56) References Cited

U.S. PATENT DOCUMENTS

| 2005/0064693 A1* | 3/2005 | Liu .......................... H01L 24/05 438/612 |
| 2005/0067693 A1* | 3/2005 | Nihei ...................... B82Y 10/00 257/720 |

(Continued)

FOREIGN PATENT DOCUMENTS

| CN | 1921147 A | 2/2007 |
| JP | 2011-3652 A1 | 1/2011 |

OTHER PUBLICATIONS

O. Ambacher, et al.; "Two-dimensional electron gases induced by spontaneous and piezoelectric polarization charges in N-and Ga-face AlGaN/GaN heterostructures;" Journal of Applied Physics; vol. 85; No. 6; Mar. 15, 1999; pp. 3222-3233 and cover sheet (13 Sheets).

(Continued)

*Primary Examiner* — Fernando L Toledo
*Assistant Examiner* — Lawrence-Linh T Nguyen
(74) *Attorney, Agent, or Firm* — Kratz, Quintos & Hanson, LLP

(57) ABSTRACT

A semiconductor device includes: a first semiconductor layer of a nitride semiconductor formed on a substrate; a second semiconductor layer of a nitride semiconductor formed on the first semiconductor layer; and a gate electrode, a source electrode, a drain electrode, and a hole extraction electrode, each of which is formed on the second semiconductor layer, wherein between the source electrode and the hole extraction electrode or in a region right under the source electrode, the first semiconductor layer and the second semiconductor layer form a vertical interface approximately perpendicular to a surface of the substrate, and a surface of the first semiconductor layer configured to form the vertical interface is an N-polar surface.

18 Claims, 23 Drawing Sheets

(56) References Cited

U.S. PATENT DOCUMENTS

2007/0200143 A1  8/2007  Saito et al.
2010/0320505 A1* 12/2010  Okamoto et al. ............. 257/192

OTHER PUBLICATIONS

N. Gardner, et al.; "Polarization anisotropy in the electroluminescence of m-plate InGaN—GaN multiple-quantum-well light-emitting diodes;" Applied Physics Letters; vol. 86; 2005; pp. 111101-1-111101-3 and cover sheet (4 Sheets).
P. Waltereit, et al.; "Growth of M-plane GaN(1 100) on gamma-LiAlO2(100);" Journal of Crystal Growth; vol. 218; 2000; pp. 143-147 (5 Sheets).
A. Kobayashi, et al.; "Room temperature epitaxial growth of m-plane GaN on lattice-matched ZnO substrates;" Applied Physics Letters; vol. 90; 2007; pp. 041908-1-041908-3 and cover sheet (4 Sheets).
R. Armitage, et al.; "M-plane GaN grown on m-sapphire by metalorganic vapor phase epitaxy;" Applied Physics Letters; vol. 92; 2008; pp. 092121-1-092121-3 and cover sheet (4 Sheets).
K. Okuno, et al.; "m-Plane GaN Films Grown on Patterned a-Plane Sapphire Substrates with 3-inch Diameter;" Applied Physics Express; vol. 2; 2009; pp. 031002-1-031002-3 (3 Sheets).
X. Ni, et al.; "Nonpolar m-plane GaN on patterned Si(112) substrates by metalorganic chemical vapor deposition;" Applied Physics Letters; vol. 95; 2009; pp. 111102-1-111102-3 and cover sheet (4 Sheets).
M. Kuroda, et al.; "Nonpolar (11-20) plane AlGaN/GaN heterojunction field effect transistors on (1-102) plane sapphire;" Journal of Applied Physics; vol. 102; 2007; pp. 093703-1-093703-5 and cover sheet (6 Sheets).
R. Shuber, et al.; "Growth of M- and A-plane GaN and LiGaO2 by plasma-assisted MBE; " AIP Conference Proceedings; vol. 1399; 2011; pp. 191-192 and cover sheet (3 Sheets).
M. Craven, et al.; "Microstructural evolution of a-plane GaN grown on a-plane SiC by metalorganic chemical vapor depostion;" Applied Physics Letters; vol. 84; No. 8; Feb. 23, 2004; pp. 1281-1283 and cover sheet (4 Sheets).
Office Action of corresponding Chinese Patent Application No. 201310541183.3 dated May 27, 2016, with full translation.

* cited by examiner

SEMICONDUCTOR DEVICE

CROSS-REFERENCE TO RELATED APPLICATION

This application is based upon and claims the benefit of priority of the prior Japanese Patent Application No. 2013-014553, filed on Jan. 29, 2013, the entire contents of which are incorporated herein by reference.

FIELD

The embodiments discussed herein are each related to a semiconductor device.

BACKGROUND

Nitride semiconductors, such as GaN, AlN, and InN, and mixed crystals thereof have a wide band gap and are used for high output electronic devices and/or short-wavelength light emitting devices. Among those mentioned above, as for a high output device, a technique relating to a field-effect transistor (FET) and, in particular, a technique relating to a high electron mobility transistor (HEMT) have been developed (for example, see Japanese Laid-open Patent Publication No. 2011-3652). The HEMT using a nitride semiconductor as described above is used for a high output/high efficiency amplifier, a high power switching device, or the like.

Incidentally, in the HEMT using a nitride semiconductor, holes are generated and accumulated in an electron transit layer functioning as a channel by impact ionization in a high electric field. When holes generated by impact ionization in a high electric field are accumulated in the electron transit layer, for example, a decrease in withstand voltage of a semiconductor device, fluctuation in drain conductance properties caused by a kink effect, and a decrease in switching speed may arise. Hence, as a method for suppressing those disadvantages, extraction of holes generated by impact ionization from the electron transit layer is effective, and Japanese Laid-open Patent Publication No. 2011-3652 has disclosed a semiconductor device having the structure in which holes generated in the electron transit layer by impact ionization are extracted.

In particular, in the semiconductor device disclosed in Japanese Laid-open Patent Publication No. 2011-3652, as depicted in FIG. 1, a substrate 910 formed of GaN or the like and having a surface along the (000-1) plane is used. In addition, on part of the substrate 910, a Ga-surface forming layer 911 formed of AlN or the like and having a surface along the (0001) plane is provided. Accordingly, on the surface of the substrate 910 on which the Ga-surface forming layer 911 is partially formed, an electron transit layer 921 is formed from GaN by crystal growth. In this case, in a region of the substrate 910 in which the Ga-surface forming layer 911 is formed, the electron transit layer 921 formed of the crystal grown GaN has a surface along the (0001) plane and includes many Ga atoms at the surface. In this application, the surface including many Ga atoms as described above will be referred to as a Ga-polar surface in some cases. On the other hand, in a region in which the Ga-surface forming layer 911 is not formed, the electron transit layer 921 formed of the crystal grown GaN has a surface along the (000-1) plane and includes many N atoms at the surface. In this application, the surface including many N atoms as described above will be referred to as an N-polar surface in some cases.

Next, on the electron transit layer 921 thus formed, an electron supply layer 922 of AlGaN is formed. Furthermore, on the electron supply layer 922 in a region in which the Ga-surface forming layer 911 is formed, a gate electrode 941, a source electrode 942, and a drain electrode 943 are formed, and on the electron supply layer 922 in a region in which the Ga-surface forming layer 911 is not formed, a hole extraction electrode 944 is formed. Since many Ga atoms are present at the surface of the electron transit layer 921 in the region in which the Ga-surface forming layer 911 is formed, in the electron transit layer 921 in the vicinity of the interface between the electron transit layer 921 and the electron supply layer 922, a two-dimensional electron gas (hereinafter referred to as "2DEG") 921a is generated. In addition, since many N atoms are present at the surface of the electron transit layer 921 in the region in which the Ga-surface forming layer 911 is not formed, in the electron transit layer 921 in the vicinity of the interface between the electron transit layer 921 and the electron supply layer 922, a two-dimensional hole gas (hereinafter referred to as "2DHG") 921b is generated.

Since the 2DHG 921b is generated in the electron transit layer 921 as described above, in the electron transit layer 921, holes generated by impact ionization can be extracted through the hole extraction electrode 944. Accordingly, the decrease in withstand voltage in a semiconductor device, the fluctuation in drain conductance properties caused by a kink effect, the decrease in switching speed, and the like can be suppressed.

In addition, besides the above Japanese Laid-open Patent Publication No. 2011-3652, the following non-patent literatures have also been discussed in this application. As the Non-Patent Literatures, for example, there may be mentioned O. Ambacher, J. Smart, J. R. Shealy, N. G. Weimann, K. Chu, M. Murphy, W. J. Schaff, and L. F. Eastman, R. Dimitrov, L. Wittmer, and M. Stutzmann, W. Rieger and J. Hilsenbeck, J. Appl. Phys. Vol. 85 (1999) 3222; N. F. Gardner, J. C. Kim, J. J. Wierer, Y. C. Shen, and M. R. Krames, Appl. Phys. Lett. 86 (2005) 111101; P. Waltereit, O. Brandt, M. Ramsteiner, R. Uecker, P. Reiche, K. H. Ploog, J. Cryst. Growth 218 (2000) 143; Atsushi Kobayashi, Satoshi Kawano, Yuji Kawaguchi, Jitsuo Ohta, and Hiroshi Fujioka, Appl. Phys. Lett. 90 (2007) 041908; R. Armitage and H. Hirayama, Appl. Phys. Lett. 92 (2008) 092121; Koji Okuno, Yoshiki Saito, Shinya Boyama, Naoyuki Nakada, Shugo Nitta, Ryoichi George Tohmon, Yasuhisa Ushida, and Naoki Shibata, Appl. Phys. Express 2 (2009) 031002; X. Ni, M. Wu, J. Lee, X. Li, A. A. Baski et al. Appl. Phys. Lett. 95 (2009) 111102; Masayuki Kuroda, Hidetoshi Ishida, Tetsuzo Ueda, and Tsuyoshi Tanaka, J. Appl. Phys. 102 (2007) 093703; R. Schuber, M. M. C. Chou, P. Vincze, Th. Schimmel, and D. M. Schaadt, AIP Conf. Proc. 1399 (2011) 191; and M. D. Craven, F. Wu, A. Chakraborty, B. Imer, U. K. Mishra et al. Appl. Phys. Lett. 84 (2004) 1281.

However, according to a semiconductor device having the structure as described above, in the electron transit layer 921 and the like, dislocations, lattice defects, and the like are liable to occur in a boundary 931 portion between the region in which the Ga-surface forming layer 911 is formed and the region in which the Ga-surface forming layer 911 is not formed.

When dislocations and lattice defects are generated in the electron transit layer 921 and the like as described above, since holes are trapped in the dislocations and/or the lattice defects, it becomes difficult to extract holes, and as a result, for example, a high voltage is inevitably applied to the hole extraction electrode 944.

SUMMARY

According to an aspect of the invention, a semiconductor device includes: a first semiconductor layer of a nitride semiconductor formed on a substrate; a second semiconductor layer of a nitride semiconductor formed on the first semiconductor layer; and a gate electrode, a source electrode, a drain electrode, and a hole extraction electrode, each of which is formed on the second semiconductor layer, wherein between the source electrode and the hole extraction electrode or in a region right under the source electrode, the first semiconductor layer and the second semiconductor layer form a vertical interface approximately perpendicular to a surface of the substrate, and a surface of the first semiconductor layer configured to form the vertical interface is an N-polar surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
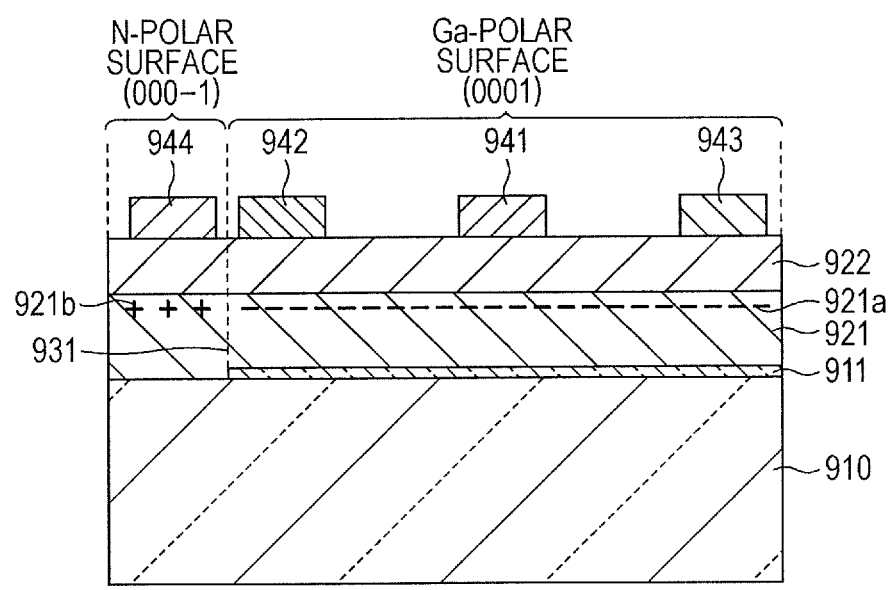
FIG. 1 is a cross-sectional structural view of a semiconductor device having a related hole extraction electrode.

Hereinafter, embodiments will be described. Incidentally, members and the like identical or similar to each other are denoted by the same reference numeral, and a duplicated description thereof will be omitted.

First Embodiment

Semiconductor Device

Figure 2:
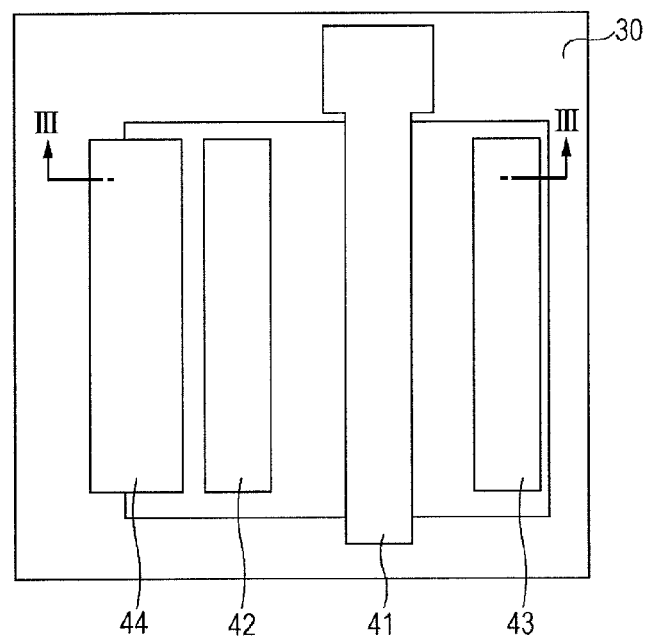
FIG. 2 is a top plan view of a semiconductor device according to a first embodiment.

A semiconductor device of a first embodiment will be described with reference to FIGS. 2 and 3. FIG. 2 is a top plan view of the semiconductor device of this embodiment, and FIG. 3 is a cross-sectional view of the semiconductor device taken along the chain line III-III in FIG. 2.

In the semiconductor device of this embodiment, an electron transit layer 21 which is a first semiconductor layer and an electron supply layer 22 which is a second semiconductor layer are formed on a substrate 10. In this embodiment, the electron transit layer 21 is formed of a GaN layer, and the electron supply layer 22 is formed of an n-AlGaN layer. On the electron supply layer 22, a gate electrode 41, a source electrode 42, a drain electrode 43, and a hole extraction electrode 44 are formed. In addition, around the source electrode 42, the drain electrode 43, and the like, an element isolation region 30 isolating an element from other elements is formed for each element.

Figure 3:
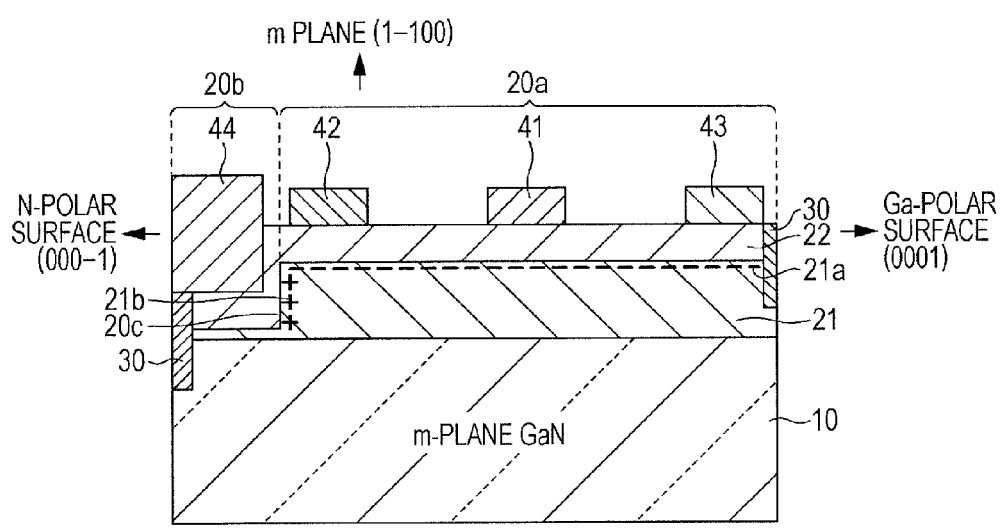
FIG. 3 is a cross-sectional view of the semiconductor device according to the first embodiment.

For example, as depicted in FIG. 3, since an m-plane (1-100) GaN substrate is used as the substrate 10, and the m plane is a non-polar plane, the surface of the GaN layer functioning as the electron transit layer 21 formed on the m plane is a non-polar surface. In addition, in the electron transit layer 21, a vertical interface 20c approximately perpendicular to a substrate 10 surface is formed between a region 20a in which the gate electrode 41, the source electrode 42, and the drain electrode 43 are formed and a region 20b in which the hole extraction electrode 44 is formed. At a surface of the electron transit layer 21 forming the vertical interface 20c as described above, many N atoms are present, so that an N-polar surface is formed. Hence, in the vicinity of the vertical interface 20c between the electron transit layer 21 and the electron supply layer 22, the polarities are different from each other, so that a 2DHG 21b is generated in the electron transit layer 21. The hole extraction electrode 44 is formed so as to be in contact with the electron supply layer 22 which covers a side surface of the electron transit layer 21. That is, between the hole extraction electrode 44 and the vertical interface 20c, the electron supply layer 22 is formed.

In this embodiment, the surface of the electron transit layer 21 forming the vertical interface 20c may be described as the side surface of the electron transit layer 21 in some cases. In addition, since the region 20a in which the gate electrode 41, the source electrode 42, and the drain electrode 43 are formed is a region in which the electron transit layer 21 is not removed by dry etching, this region may be described in some cases as the region 20a in which the electron transit layer 21 is not removed by dry etching. In addition, besides the case in which the vertical interface 20c is perpendicular to the substrate 10 surface, although being slightly inclined with respect to the normal of the substrate 10 surface, the side surface of the electron transit layer 21 which is an N-polar surface is also regarded as the vertical interface 20c. The vertical interface 20c described above is formed in a region between the source electrode 42 and the hole extraction electrode 44 or in a region right under the source electrode 42.

In addition, in the region 20a in which the gate electrode 41, the source electrode 42, and the drain electrode 43 are formed, a 2DEG 21a is generated in the electron transit layer 21 in the vicinity of the interface between the electron transit layer 21 and the electron supply layer 22.

In the semiconductor device of this embodiment, a negative potential or a potential of 0 V is applied to the hole extraction electrode 44. Hence, since the 2DHG 21b is generated in the vicinity of the vertical interface 20c between the region 20a and the region 20b, even when holes are generated in the region 20a, the holes can be efficiently extracted by the hole extraction electrode 44. In addition, since lattice defects, dislocations, and the like are not generated in the vicinity of the vertical interface 20c between the region 20a and the region 20b, holes are not trapped in the vicinity of the vertical interface 20c. Accordingly, in the semiconductor device of this embodiment, the withstand voltage, the switching speed, and the like can be improved.

Figure 4:
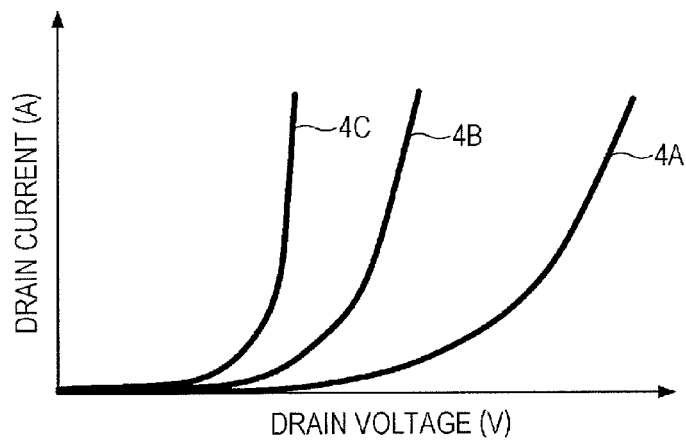
FIG. 4 is a graph illustrating an effect of the semiconductor device according to the first embodiment.

FIG. 4 is a graph illustrating an effect of the semiconductor device of this embodiment and indicating the relationship between a drain voltage and a drain current obtained when the gate voltage is applied so that the semiconductor device is placed in an off state. A curve 4A indicates the characteristics of the semiconductor device of this embodiment depicted in FIGS. 2 and 3. In addition, a curve 4B indicates the characteristics of the semiconductor device depicted in FIG. 1, and a curve 4C indicates the characteristics of a semiconductor device in which no hole extraction electrode is formed. As indicated by the curves 4B and 4C in FIG. 4, when the hole extraction electrode having the structure depicted in FIG. 1 is formed, the withstand voltage and the like can be improved. In addition, as indicated by the curves 4A and 4B in FIG. 4, when a semiconductor device is formed to have the same structure as that of the semiconductor device of this embodiment, the withstand voltage and the like can be improved as compared to those of the semiconductor device depicted in FIG. 1.

The case has been described in which as the substrate 10, an m-plane GaN substrate having an m-plane surface is used. However, as the substrate 10, for example, there may also be used a substrate having an m-plane surface or a substrate having an a-plane surface which is a non-polar surface as is the m-plane surface. In particular, for example, an m-plane AlN substrate, an m-plane SIC substrate, a γ-LiAlO$_2$ (100) substrate, an m-plane ZnO substrate, an m-plane sapphire substrate, an a-plane sapphire substrate having a patterned surface, and a Si (112) substrate having a patterned surface may be used. In addition, for example, an a-plane GaN substrate, an a-plane AlN substrate, an a-plane ZnO substrate, an a-plane SIC substrate, an r-plane sapphire substrate, and a LiGaO$_2$ (010) substrate may also be used. In this embodiment, the "substrate having a patterned surface" indicates a substrate having a surface in which a predetermined concavo-convex shape or the like is formed.

Figure 5:
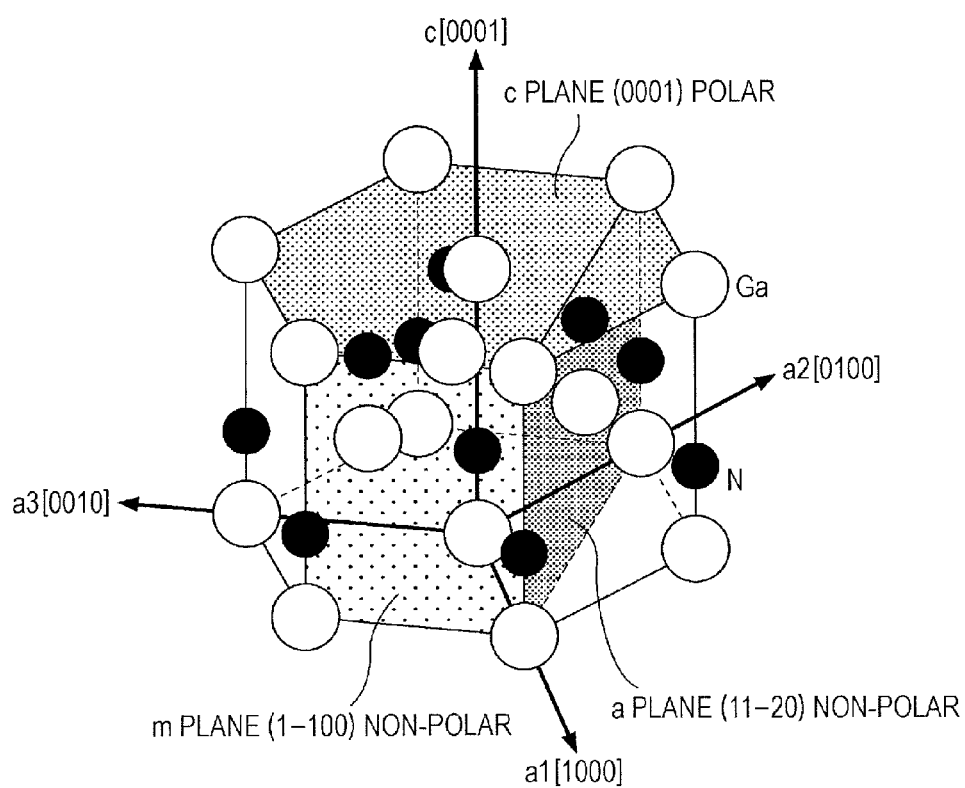
FIG. 5 is a schematic view illustrating the crystal structure of GaN.

In addition, as the surface of the substrate 10, besides the non-polar surface, such as the m-plane surface or the a-plane surface, a surface which is perpendicular to the c plane and is located between the m plane and the a plane may also be used, and for example, as depicted in FIG. 5, a surface which is perpendicular to the c plane and which is located between the m plane (1-100) and the a plane (11-20) may be used. In addition, a surface which is perpendicular to the c plane and which is located between the a plane (11-20) and the m plane (10-10) not depicted in FIG. 5 may also be used. FIG. 5 is a view illustrating the crystal structure of GaN.

In addition, the substrate 10 may be, for example, a silicon substrate having a surface on which an m-plane film, an a-plane film, or the like is formed. In particular, there may be used a substrate having a surface on which a film of m-plane AlN, m-plane SiC, γ-LiAlO$_2$ (100), m-plane ZnO, m-plane sapphire, a-plane sapphire having a patterned surface, Si (112) having a patterned surface, or the like is formed. In addition, there may be used a substrate having a surface on which a film of a-plane GaN, a-plane AlN, a-plane ZnO, a-plane SiC, r-plane sapphire, LiGaO$_2$ (010), or the like is formed. Hence, the substrate 10 may be a substrate having a surface which is a so-called template for crystal growth of m-plane GaN, a-plane GaN, or the like.

Method for Manufacturing Semiconductor Device

Next, a method for manufacturing the semiconductor device according to this embodiment will be described.

Figure 6A:
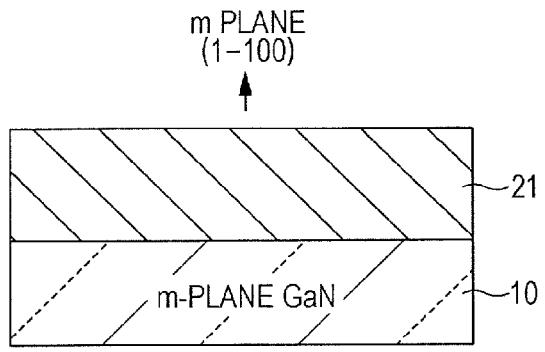
FIGS. 6A to 6C depict a process (1) of a method for manufacturing the semiconductor device according to the first embodiment.

First, as depicted in FIG. 6A, an undoped GaN layer functioning as the electron transit layer 21 is formed on the substrate 10 by epitaxial growth using plasma-assisted molecular beam epitaxy (PAMBE) to have a thickness of 1.5 μm. As the substrate 10, an m-plane (1-100) GaN substrate is used. When the electron transit layer 21 is formed by PAMBE, Ga and ammonia (NH$_3$) are used as raw materials, and a substrate temperature is set to 720° C. Instead of using PAMBE, the electron transit layer 21 may be formed using metal organic vapor phase epitaxy (MOVPE). In this embodiment, although the case in which an m-plane (1-100) GaN substrate is used as the substrate 10 will be described by way of example, the surface of the substrate 10 may be along the m plane, the a plane, or the like described above.

Figure 6B:
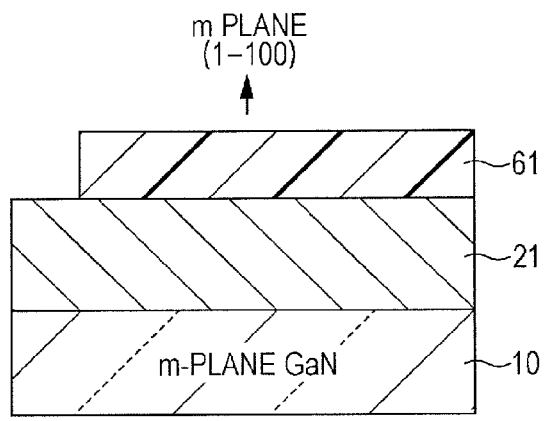

Next, as depicted in FIG. 6B, a resist pattern 61 is formed on the electron transit layer 21. In particular, after a photoresist is applied on the electron transit layer 21, exposure and development are performed using an exposure apparatus, so that the resist pattern 61 is formed. In addition, the resist pattern 61 is formed so that the side surface of the electron transit layer 21 formed by removing a part thereof functions as an N-polar surface.

Figure 6C:
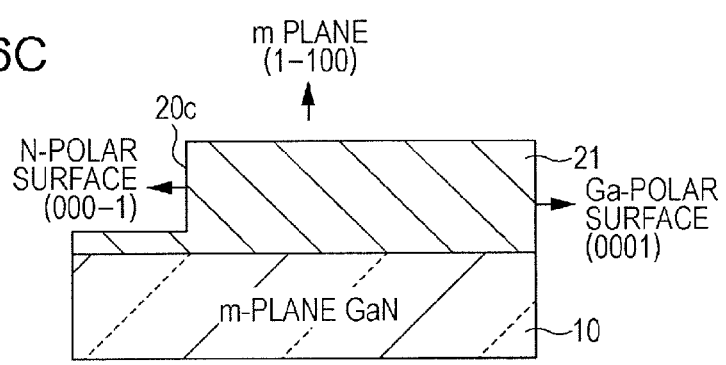

Next, as depicted in FIG. 6C, the part of the electron transit layer 21 in a region in which the resist pattern 61 is not formed is removed by dry etching. By this etching, the part of the electron transit layer 21 is removed, and by the side surface of the electron transit layer 21 exposed by the dry etching, a surface functioning as the vertical interface 20c is formed. The surface functioning as this vertical interface 20c is, for example, an N-polar surface (000-1), and a surface facing and parallel to this surface functions as a Ga-polar surface (0001). In addition, the vertical interface 20c is formed at a side at which the source electrode 42, which will be described later, is formed, that is, between the source electrode 42 and the hole extraction electrode 44 or in a region right under the source electrode 42. Subsequently, by using an organic alkali, such as a tetramethyl ammonium hydride (TMAH) solution, a surface treatment is performed, and at the same time, the resist pattern 61 is removed.

Figure 7A:
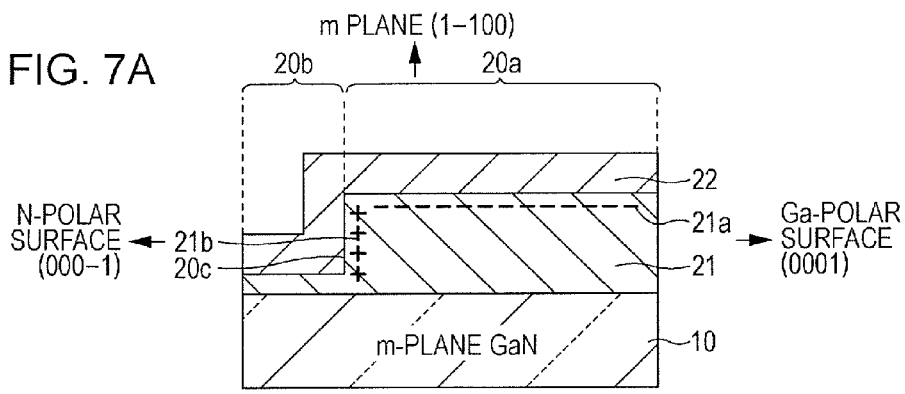
FIGS. 7A to 7C depict a process (2) of a method for manufacturing the semiconductor device according to the first embodiment.

Next, as depicted in FIG. 7A, the electron supply layer 22 is formed on the electron transit layer 21. In particular, in order to form the electron supply layer 22, an AlGaN layer is epitaxially grown by PAMBE to have a thickness of 25 nm. When the electron supply layer 22 formed in this case is represented by $Al_xGa_{1-x}N$, x indicates 0.15 to 0.25. When the electron supply layer 22 is formed by PAMBE, Al, Ga, and ammonia are used as raw materials, and as an n-type impurity element, Si is doped so as to have a concentration of approximately $5 \times 10^{18}$ cm$^{-3}$. The electron supply layer 22 may be formed by MOVPE instead of using PAMBE. Accordingly, in the region 20a in which the electron transit layer 21 is not removed by dry etching, the 2DEG 21a is generated in the electron transit layer 21 in the vicinity of the interface between the electron transit layer 21 and the electron supply layer 22. In addition, in the electron transit layer 21 in the vicinity of the vertical interface 20c functioning as the side surface of the electron transit layer 21 formed by dry etching, the 2DHG 21b is generated.

Figure 7B:
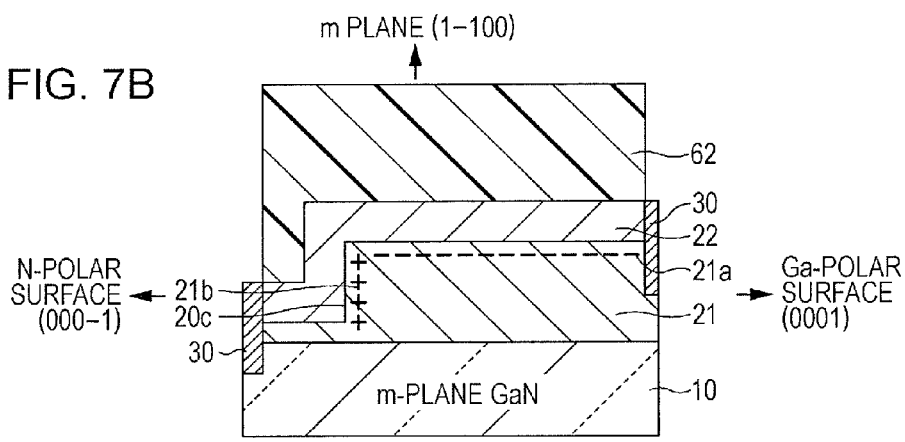

Next, as depicted in FIG. 7B, the element isolation region 30 is formed. In particular, after a photoresist is applied on the electron supply layer 22, exposure and development are performed using an exposure apparatus, so that a resist pattern 62 is formed in a region other than that in which the element isolation region 30 is to be formed. Subsequently, in the region in which the resist pattern 62 is not formed, the element isolation region 30 is formed by performing ion-implantation of ions of boron, argon, or the like. In addition, the element isolation region 30 may also be formed to have a mesa structure by dry etching using a chlorine-based etching gas. Subsequently, the resist pattern 62 is removed by an organic solvent or the like.

Figure 7C:
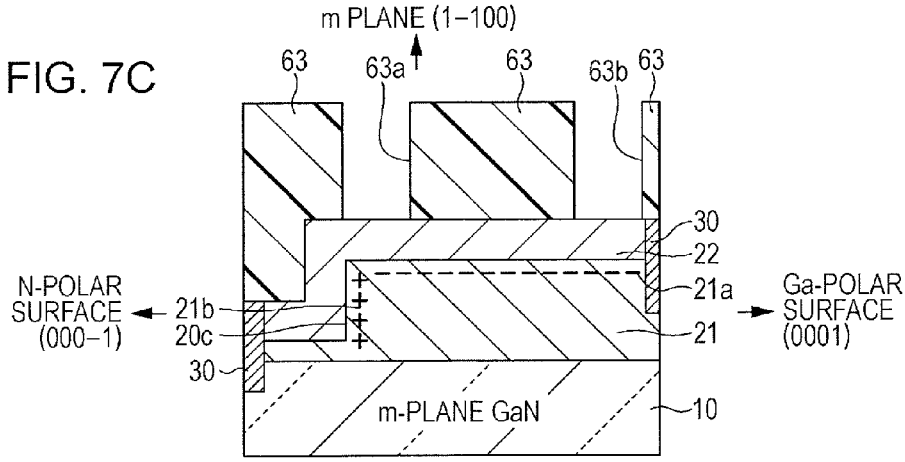

Next, as depicted in FIG. 7C, in a region in which the source electrode 42 and the drain electrode 43 are to be formed, a resist pattern 63 having openings 63a and 63b is formed. In particular, after a photoresist is applied on the electron supply layer 22, exposure and development are performed using an exposure apparatus, so that the resist pattern 63 having the openings 63a and 63b is formed in the region in which the source electrode 42 and the drain electrode 43 are to be formed.

Figure 8A:
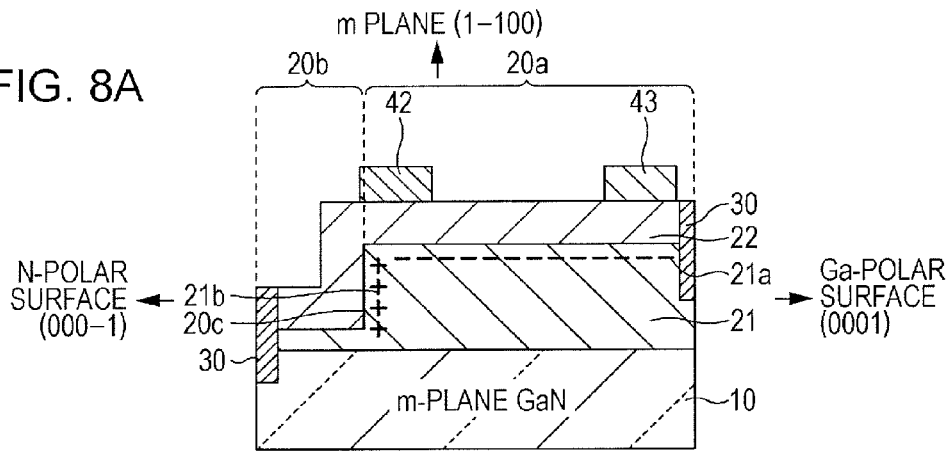
FIGS. 8A to 8C depict a process (3) of the method for manufacturing the semiconductor device according to the first embodiment.

Next, as depicted in FIG. 8A, the source electrode 42 and the drain electrode 43 are formed. In particular, after a metal film containing Ti and Al laminated to each other is formed by vacuum deposition or the like on the surface on which the resist pattern 63 is formed and is then immersed in an organic solvent or the like, a metal film on the resist pattern 63 is removed together with the resist pattern 63 by lift-off. Accordingly, metal films formed in the openings 63a and 63b of the resist pattern 63 are allowed to remain, so that the source electrode 42 and the drain electrode 43 are formed on the electron supply layer 22. As described above, on the electron supply layer 22 in the region 20a, the source electrode 42 and the drain electrode 43 are formed. Subsequently, by performing rapid thermal annealing (RTA) at a temperature of 600° C., the source electrode 42 and the drain electrode 43 are each ohmic-contacted.

Figure 8B:
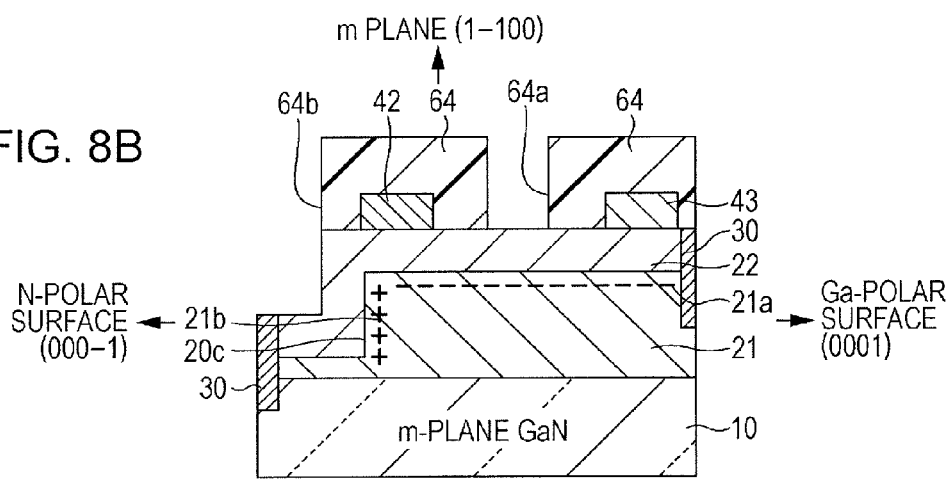

Next, as depicted in FIG. 8B, a resist pattern 64 having openings 64a and 64b is formed in a region in which the gate electrode 41 and the hole extraction electrode 44 are to be formed. In particular, after a photoresist is applied on the electron supply layer 22, exposure and development are performed using an exposure apparatus, so that the resist pattern 64 having the openings 64a and 64b is formed in the region in which the gate electrode 41 and the hole extraction electrode 44 are to be formed.

Figure 8C:
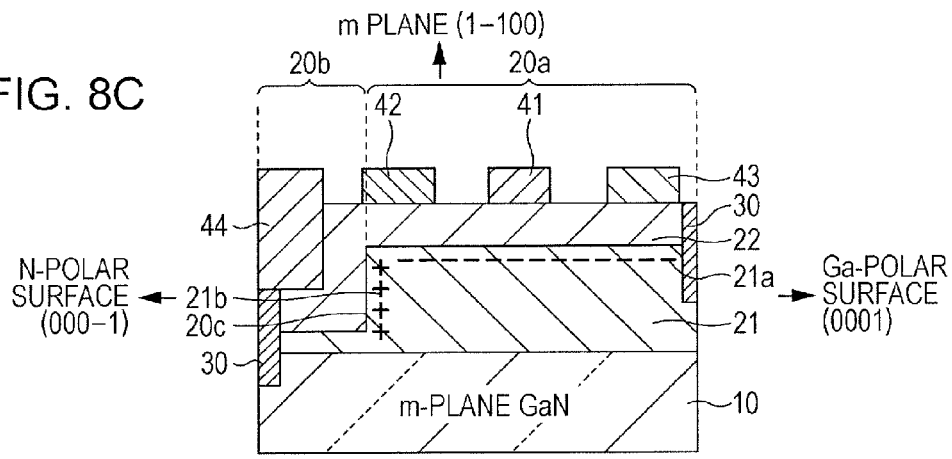

Next, as depicted in FIG. 8C, the gate electrode 41 and the hole extraction electrode 44 are formed. In particular, after a metal film containing Ni and Au laminated to each other is formed by vacuum deposition or the like on the surface on which the resist pattern 64 is formed and is then immersed in an organic solvent or the like, a metal film on the resist pattern 64 is removed together with the resist pattern 64 by lift-off. Accordingly, metal films formed in the openings 64a and 64b of the resist pattern 64 are allowed to remain, so that the gate electrode 41 and the hole extraction electrode 44 are formed on the electron supply layer 22. The gate electrode 41 described above is formed on the electron supply layer 22 in the region 20a, and the hole extraction electrode 44 is formed at the side surface of the electron transit layer 21 functioning as the vertical interface 20c with the electron supply layer 22 interposed therebetween. In addition, since having a relatively high work function, Ni forms a Schottky barrier at the Ga-polar surface and has ohmic characteristics at the N-polar surface. In addition, in order to improve the ohmic characteristics, annealing may be performed at a temperature of 400° C. for 5 minutes.

Figure 9:
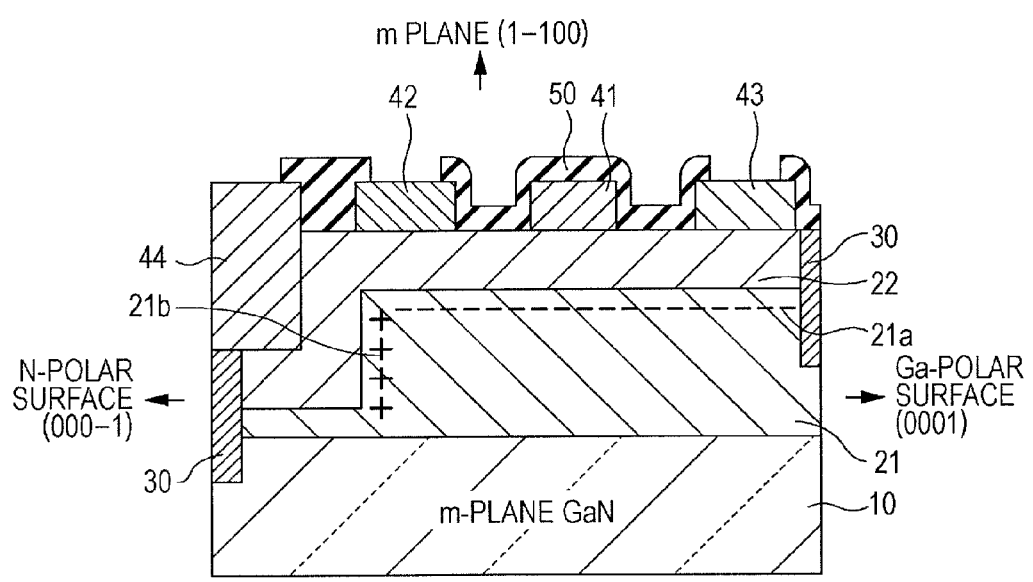
FIG. 9 depicts a process (4) of the method for manufacturing the semiconductor device according to the first embodiment.

Next, as depicted in FIG. 9, an insulating layer 50 used for passivation is formed in a region including an upper portion of the electron supply layer 22. In particular, an insulating film, such as a SiN film, is further formed over the electron supply layer 22 by chemical vapor deposition (CVD) or the like. Subsequently, on this insulating film, although not being depicted, a resist pattern having an opening in a contact region for each electrode is formed. Furthermore, an insulating film in a region in which the resist pattern is not formed is removed by dry etching, so that the semiconductor device of this embodiment can be formed. In addition, subsequently, the resist pattern is removed by an organic solvent or the like.

MODIFIED EXAMPLE 1

Figure 10:
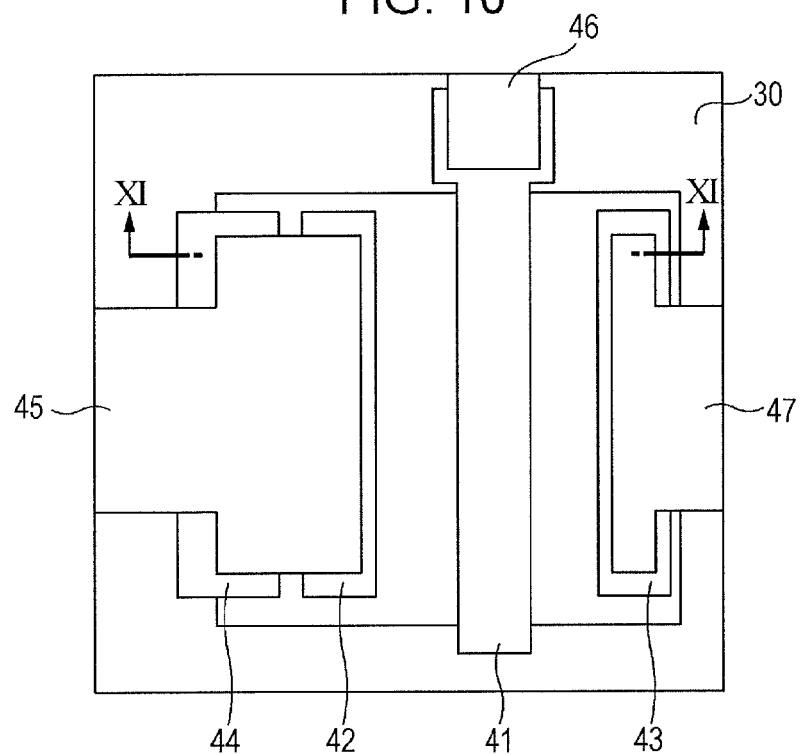
FIG. 10 is a top plan view of a modified example 1 of the semiconductor device according to the first embodiment.
Figure 11:
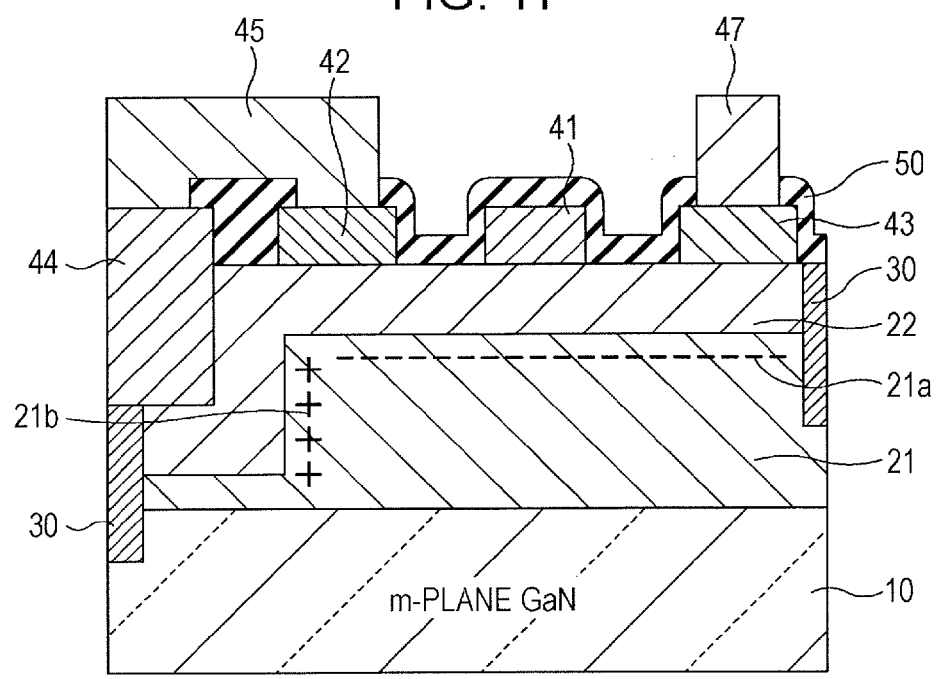
FIG. 11 is a cross-sectional view of the modified example 1 of the semiconductor device according to the first embodiment.

As depicted in FIGS. 10 and 11, the semiconductor device of this embodiment may also have the structure in which the source electrode 42 and the hole extraction electrode 44 are electrically connected to each other in the semiconductor device depicted in FIG. 9. That is, as the semiconductor device of a modified example of this embodiment depicted in FIGS. 10 and 11, the source electrode 42 and the hole extraction electrode 44 may be electrically connected to each other with a source wire 45. In addition, FIG. 10 is a top plan view of the semiconductor device of the modified example, and FIG. 11 is a cross-sectional view of the semiconductor device taken along the chain line XI-XI in FIG. 10.

In the semiconductor device of this modified example, the source electrode 42 and the hole extraction electrode 44 are connected to each other and are also grounded by the same source wire 45. Hence, 0 V is applied to the hole extraction electrode 44. In the semiconductor device of this embodiment, since lattice defects, dislocations, and the like are not likely to be formed between the source electrode 42 and the hole extraction electrode 44, even when a ground potential is applied to the hole extraction electrode 44, holes can be efficiently extracted. In addition, in the semiconductor device of this modified example, a gate wire 46 is connected to the gate electrode 41, and a drain wire 47 is connected to the drain electrode 43.

MODIFIED EXAMPLE 2

Figure 12:
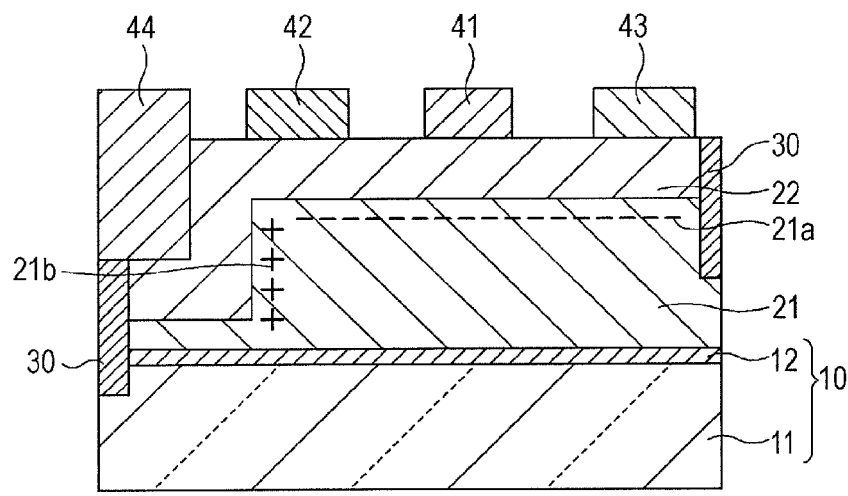
FIG. 12 is a cross-sectional view of a modified example 2 of the semiconductor device according to the first embodiment.

In addition, as depicted in FIG. 12, in the semiconductor device of this embodiment, the substrate 10 may be a silicon substrate 11 having the structure as described above on which a crystalline film 12 having an m-plane surface, an a-plane surface, or the like is formed. Furthermore, instead of using the silicon substrate 11, a sapphire substrate, a SiC substrate, or the like may also be used.

Although the case in which AlGaN/GaN is used as a nitride semiconductor has been described above, as a nitride semiconductor, a material, such as InGaN, InAlN, or InAlGaN, may also be used. For example, AlGAN/InGaN, InAlN/GaN, or InAlGaN/InGaN may also be used.

Second Embodiment

Figure 13:
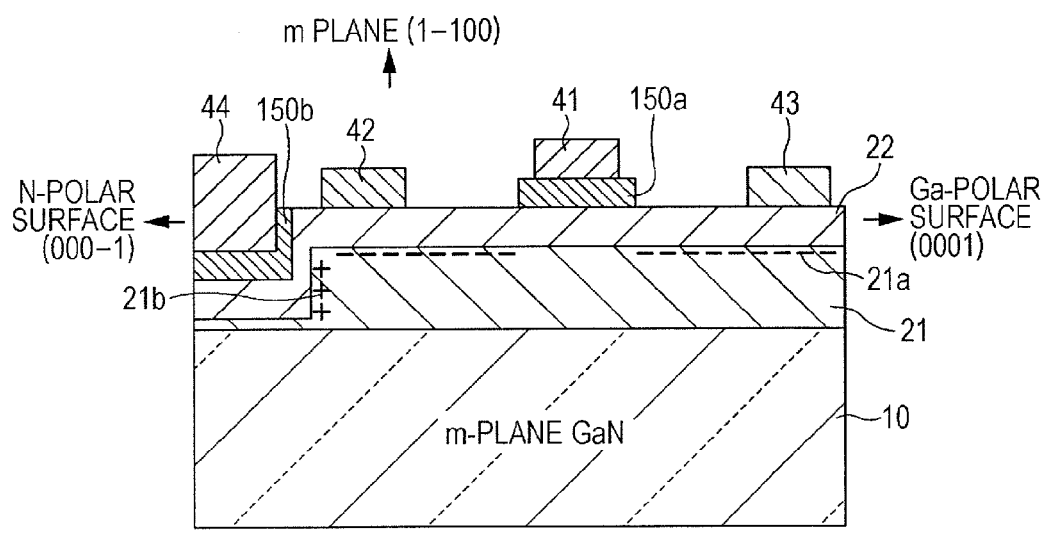
FIG. 13 is a cross-sectional structural view of a semiconductor device according to a second embodiment.

Next, a second embodiment will be described with reference to FIG. 13. A semiconductor device of this embodiment has the structure in which between the electron supply layer 22 and the gate electrode 41, a p-type layer 150*a* is formed from p-GaN, and between the electron supply layer 22 and the hole extraction electrode 44, a p-type layer 150*b* is formed from p-GaN. In the semiconductor device of this embodiment, since the p-type layer 150*a* is formed between the electron supply layer 22 and the gate electrode 41, the 2DEG 21*a* right under the gate electrode 41 can be dissipated, and hence a normally off state can be achieved. In addition, since the p-type layer 150*b* is formed from p-GaN between the electron supply layer 22 and the hole extraction electrode 44, the concentration of the 2DHG 21*b* generated at the interface 20*c* can be increased, and hence extraction of holes can be more efficiently carried out. In this embodiment, although the case in which both the p-type layers 150*a* and 150*b* are formed is described, the structure in which one of the p-type layers 150*a* and 150*b* is formed may also be used. In the case described above, the effect obtained by the formation of the p-type layer 150*a* or the effect obtained by the formation of the p-type layer 150*b* may be obtained.

Method for Manufacturing Semiconductor Device

Next, a method for manufacturing the semiconductor device according to this embodiment will be described.

Figure 14A:
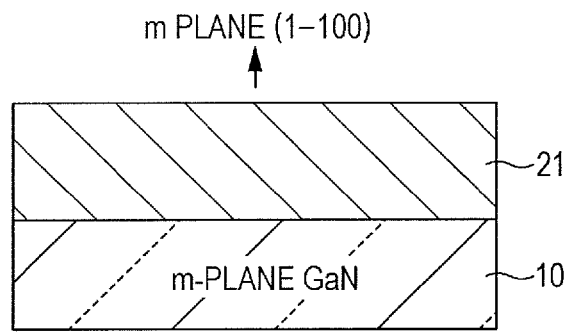
FIGS. 14A to 14C depict a process (1) of a method for manufacturing the semiconductor device according to the second embodiment.

First, as depicted in FIG. 14A, an undoped GaN layer functioning as the electron transit layer 21 is formed on the substrate 10 by epitaxial growth using PAMBE to have a thickness of 1.5 μm. As the substrate 10, an m-plane (1-100) GaN substrate is used. When the electron transit layer 21 is formed by PAMBE, Ga and ammonia (NH$_3$) are used as raw materials, and the substrate temperature is set to 720° C.

Figure 14B:
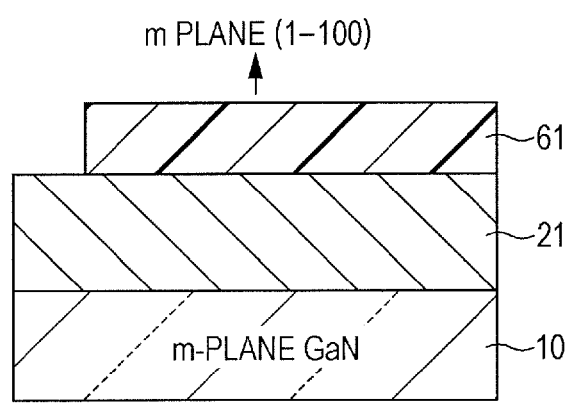

Next, as depicted in FIG. 14B, the resist pattern 61 is formed on the electron transit layer 21. In particular, after a photoresist is applied on the electron transit layer 21, exposure and development are performed using an exposure apparatus, so that the resist pattern 61 is formed. In addition, the resist pattern 61 is formed so that a side surface of the electron transit layer 21 formed by removing a part thereof functions as an N-polar surface.

Figure 14C:
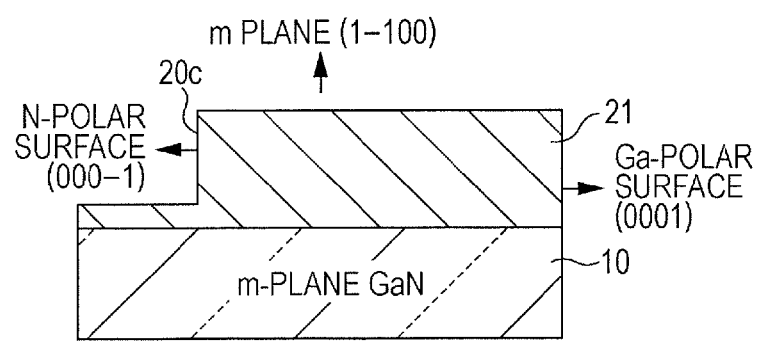

Next, as depicted in FIG. 14C, the part of the electron transit layer 21 in a region in which the resist pattern 61 is not formed is removed by dry etching. By this etching, the part of the electron transit layer 21 is removed, and by the side surface of the electron transit layer 21 exposed by the dry etching, a surface functioning as the vertical interface 20*c* is formed. The surface functioning as this vertical interface 20*c* is an N-polar surface (000-1), and a surface facing and parallel to this surface functions as a Ga-polar surface (0001). In addition, the vertical interface 20*c* is formed at a side at which the source electrode 42, which will be described later, is formed, that is, between the source electrode 42 and the hole extraction electrode 44 or in a region right under the source electrode 42. Subsequently, by using an organic alkali, such as a tetramethyl ammonium hydride (TMAH) solution, a surface treatment is performed, and at the same time, the resist pattern 61 is removed.

Figure 15A:
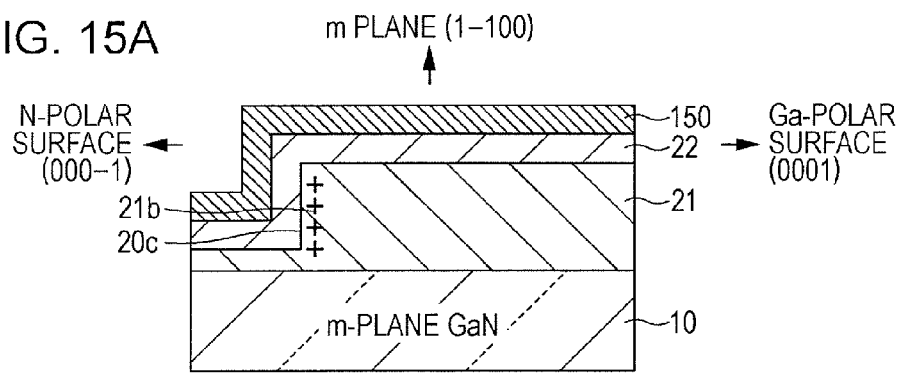
FIGS. 15A to 15C depict a process (2) of the method for manufacturing the semiconductor device according to the second embodiment.

Next, as depicted in FIG. 15A, the electron supply layer 22 and a p-type film 150 are sequentially formed on the electron transit layer 21. In particular, in order to form the electron supply layer 22, an AlGaN layer is formed by epitaxial growth using PAMBE to have a thickness of 25 nm. When the electron supply layer 22 formed in this case is represented by Al$_x$Ga$_{1-x}$N, x indicates 0.15 to 0.25. When the electron supply layer 22 is formed by PAMBE, Al, Ga, and ammonia are used as raw materials, and as an n-type impurity element, Si is doped so as to have a concentration of approximately $5\times10^{18}$ cm$^{-3}$. In addition, the p-type film 150 is formed by epitaxial growth using PAMBE until a desired thickness is obtained, and Mg used as a p-type impurity element is doped in GaN to have a concentration of approximately $1\times10^{19}$ cm$^{-3}$. Accordingly, in the electron transit layer 21 in the vicinity of the vertical interface 20*c* functioning as the side surface of the electron transit layer 21 formed by dry etching, the 2DHG 21*b* is generated.

Figure 15B:
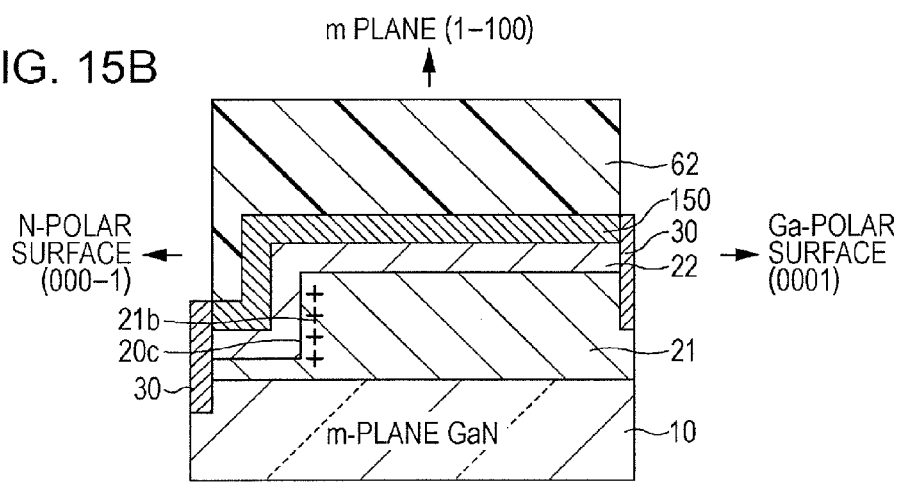

Next, as depicted in FIG. 15B, the element isolation region 30 is formed. In particular, after a photoresist is applied on the p-type film 150, exposure and development are performed using an exposure apparatus, so that the resist pattern 62 is formed in a region other than the region in which the element isolation region 30 is to be formed. Subsequently, in a region in which the resist pattern 62 is not formed, the element isolation region 30 is formed by performing ion-implantation of ions of boron, argon, or the like. In addition, the element isolation region 30 may be formed to have a mesa structure by dry etching using a chlorine-based etching gas. Subsequently, the resist pattern 62 is removed by an organic solvent or the like.

Figure 15C:
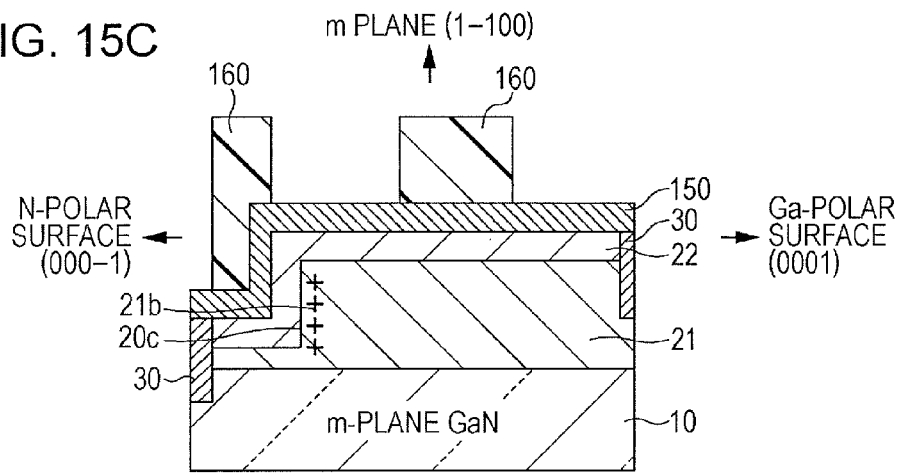

Next, as depicted in FIG. 15C, a resist pattern 160 is formed on the p-type film 150 in a region in which the p-type layers 150*a* and 150*b* are to be formed. In particular, after a photoresist is applied on the p-type film 150, exposure and development are performed using an exposure apparatus, so that the resist pattern 160 is formed on the p-type film 150 in the region in which the p-type layers 150*a* and 150*b* are to be formed.

Figure 16A:
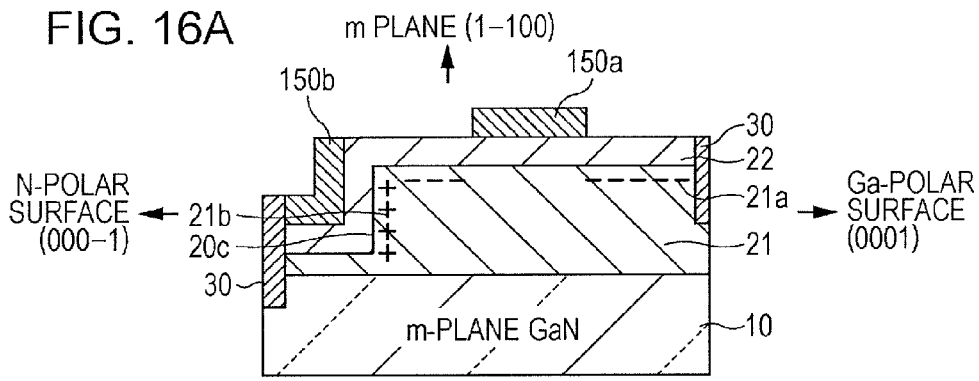
FIGS. 16A to 16C depict a process (3) of the method for manufacturing the semiconductor device according to the second embodiment.

Next, as depicted in FIG. 16A, the p-type film 150 in the region in which the resist pattern 160 is not formed is remove by dry etching or the like, so that the p-type layers 150*a* and 150*b* are formed from the remaining p-type film 150. Accordingly, in the region 20*a*, the 2DEG 21*a* is generated in the electron transit layer 21 in the vicinity of the interface between the electron transit layer 21 and the electron supply layer 22 except the region right under the p-type layer 150*a*. Subsequently, the resist pattern 160 is removed by an organic solvent or the like.

Figure 16B:
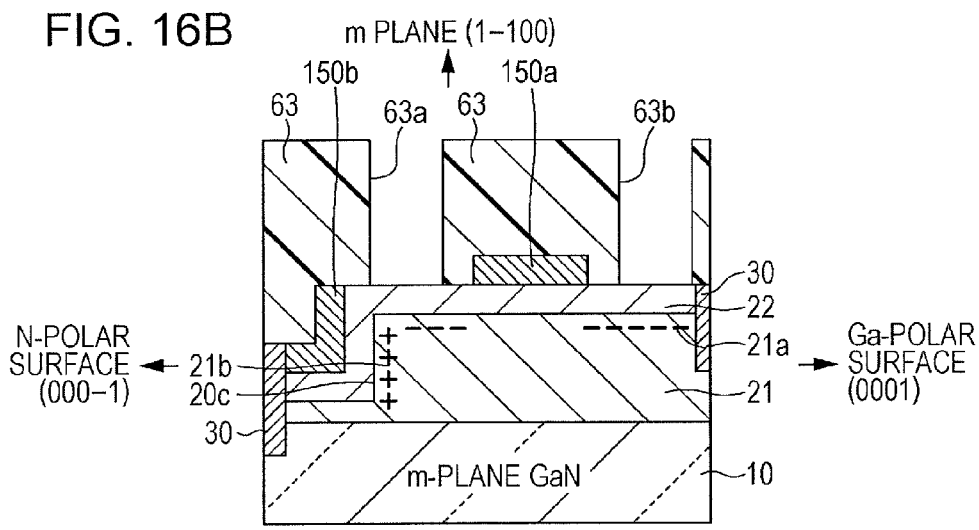

Next, as depicted in FIG. 16B, the resist pattern 63 having the openings 63a and 63b is formed in the region in which the source electrode 42 and the drain electrode 43 are to be formed. In particular, after a photoresist is applied on the electron supply layer 22 and the p-type layers 150a and 150b, exposure and development are performed using an exposure apparatus. Accordingly, the resist pattern 63 having the openings 63a and 63b is formed in the region in which the source electrode 42 and the drain electrode 43 are to be formed.

Figure 16C:
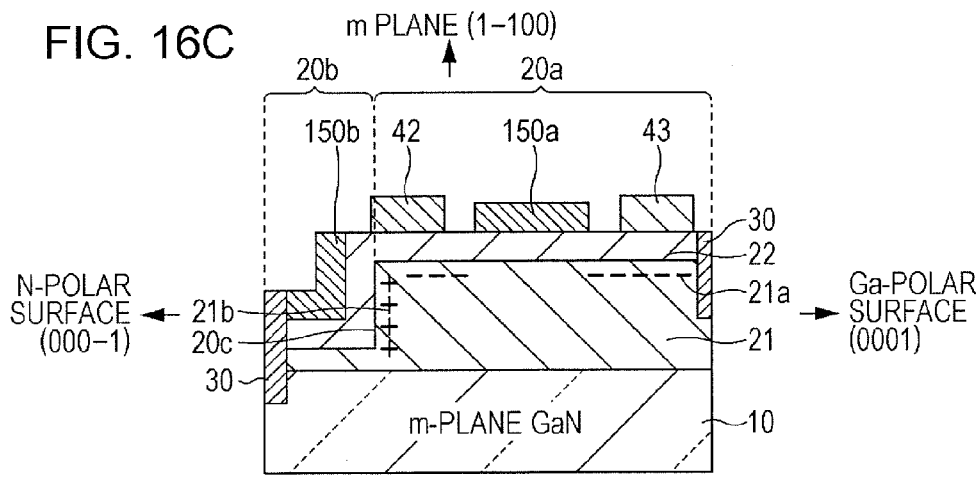

Next, as depicted in FIG. 16C, the source electrode 42 and the drain electrode 43 are formed. In particular, after a metal film containing Ti and Al laminated to each other is formed by vacuum deposition or the like on the surface on which the resist pattern 63 is formed and is then immersed in an organic solvent or the like, a metal film on the resist pattern 63 is removed together with the resist pattern 63 by lift-off. Accordingly, metal films formed in the openings 63a and 63b of the resist pattern 63 are allowed to remain, so that the source electrode 42 and the drain electrode 43 are formed on the electron supply layer 22. As described above, on the electron supply layer 22 in the region 20a, the source electrode 42 and the drain electrode 43 are formed. Subsequently, by performing rapid thermal annealing (RTA) at a temperature of 600° C., the source electrode 42 and the drain electrode 43 are each ohmic-contacted.

Figure 17A:
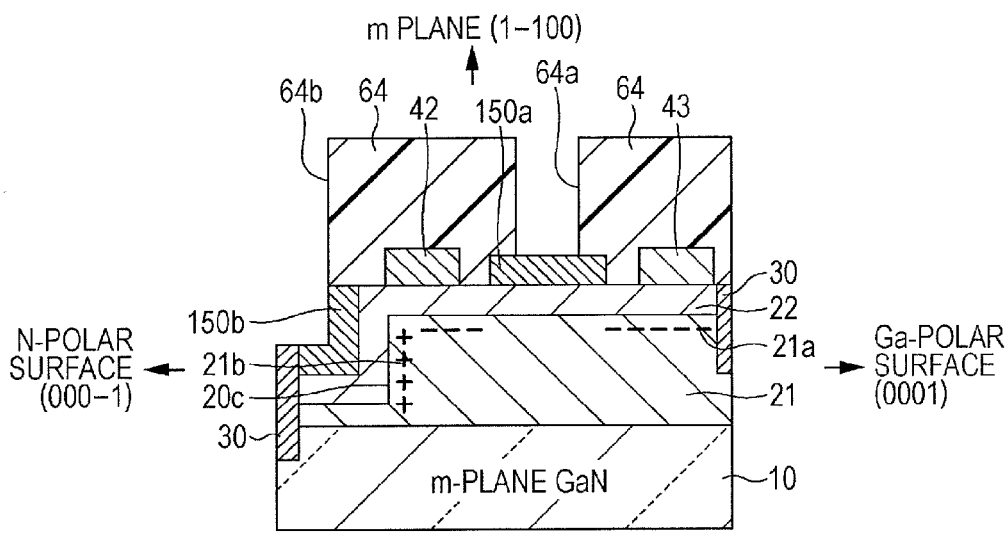
FIGS. 17A and 17B depict a process (4) of the method for manufacturing the semiconductor device according to the second embodiment.

Next, as depicted in FIG. 17A, the resist pattern 64 having the openings 64a and 64b is formed in a region in which the gate electrode 41 and the hole extraction electrode 44 are to be formed. In particular, after a photoresist is applied on the electron supply layer 22 and the p-type layers 150a and 150b, exposure and development are performed using an exposure apparatus. Accordingly, the resist pattern 64 having the openings 64a and 64b is formed in the region in which the gate electrode 41 and the hole extraction electrode 44 are to be formed.

Figure 17B:
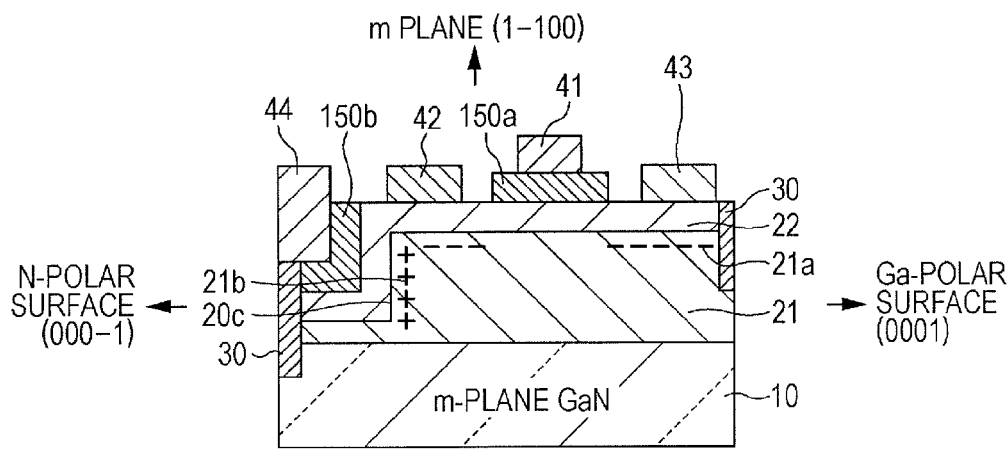

Next, as depicted in FIG. 17B, the gate electrode 41 and the hole extraction electrode 44 are formed. In particular, after a metal film containing Ni and Au laminated to each other is formed by vacuum deposition or the like on the surface on which the resist pattern 64 is formed and is then immersed in an organic solvent or the like, a metal film on the resist pattern 64 is removed together with the resist pattern 64 by lift-off. Accordingly, metal films formed in the openings 64a and 64b of the resist pattern 64 are allowed to remain, so that the gate electrode 41 and the hole extraction electrode 44 are formed. Hence, the gate electrode 41 is formed on the p-type layer 150a, and at the side surface of the electron transit layer 21 functioning as the vertical interface 20c, the hole extraction electrode 44 is formed with the electron supply layer 22 and the p-type layer 150b interposed therebetween.

Subsequently, as in the case of the first embodiment, the insulating layer 50 may also be formed for passivation. In addition, members, methods, and the like other than those described above are similar to those of the first embodiment.

Third Embodiment

Figure 18:
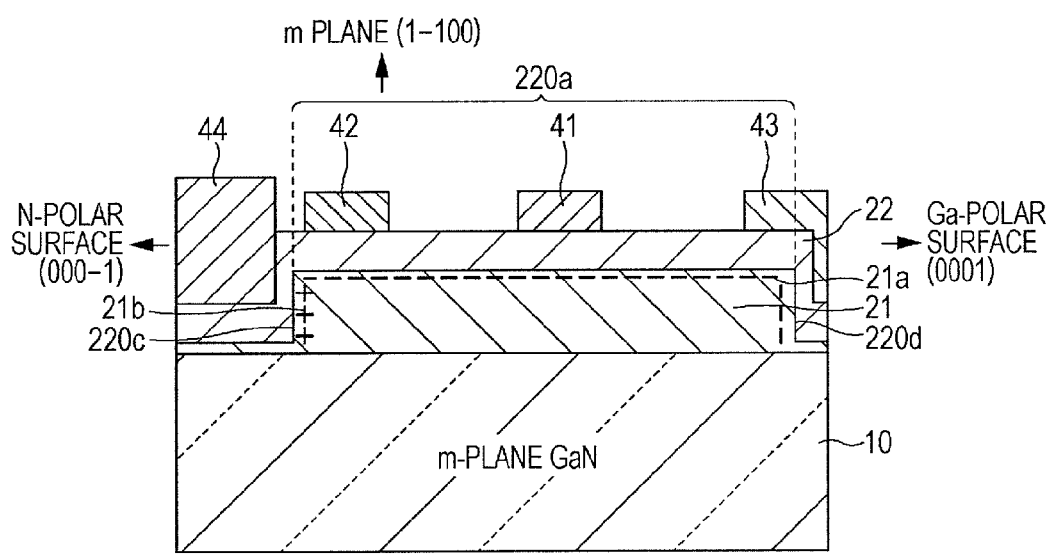
FIG. 18 is a cross-sectional structural view of a semiconductor device according to a third embodiment.

Next, a third embodiment will be described with reference to FIG. 18. In this embodiment, the structure will be described in which in a region right under the drain electrode 43, a second vertical interface 220d functioning as the interface between the electron transit layer 21 and the electron supply layer 22 is formed approximately perpendicular to the substrate 10 surface. In particular, a semiconductor device of this embodiment has the structure in which at side surfaces of the electron transit layer 21 in a region 220a in which the electron transit layer 21 is not removed by dry etching, a surface functioning as a first vertical interface 220c and a surface functioning as the second vertical interface 220d are formed. The surface functioning as the first vertical interface 220c and the surface functioning as the second vertical interface 220d formed as described above are surfaces approximately perpendicular to the substrate 10 surface. In addition, on the electron supply layer 22 in the region 220a, the gate electrode 41, the source electrode 42, and a part of the drain electrode 43 are formed. In this embodiment, the first vertical interface 220c corresponds to the vertical interface 20c of each of the first and the second embodiments and is formed between the source electrode 42 and the hole extraction electrode 44 or in a region right under the source electrode 42.

In this embodiment, the first vertical interface 220c and the second vertical interface 220d face each other and are approximately parallel to each other. Hence, the surface of the electron transit layer 21 at the first vertical interface 220c is along the (000-1) plane and is an N-polar surface, and the surface of the electron transit layer 21 at the second vertical interface 220d is along the (0001) plane and is a Ga-polar surface. As described above, when the second vertical interface 220d is formed right under the drain electrode 43 by the surface functioning as the Ga-polar surface of the electron transit layer 21, the concentration of electrons in the 2DEG 21a in the vicinity of the second vertical interface 220d can be increased as compared to that of the other portions. Accordingly, an ON-resistance can be decreased.

Method for Manufacturing Semiconductor Device

Next, a method for manufacturing the semiconductor device according to this embodiment will be described.

Figure 19A:
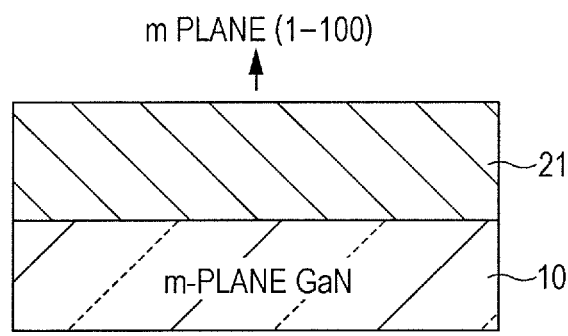
FIGS. 19A to 19C depict a process (1) of a method for manufacturing the semiconductor device according to the third embodiment.

First, as depicted in FIG. 19A, on the substrate 10, an undoped GaN layer functioning as the electron transit layer 21 is formed by epitaxial growth using PAMBE to have a thickness of 1.5 μm. As the substrate 10, an m-plane (1-100) GaN substrate is used. When the electron transit layer 21 is formed by PAMBE, Ga and ammonium are used as raw materials, and the substrate temperature is set to 720° C. The electron transit layer 21 may be formed by MOVPE instead of using PAMBE.

Figure 19B:
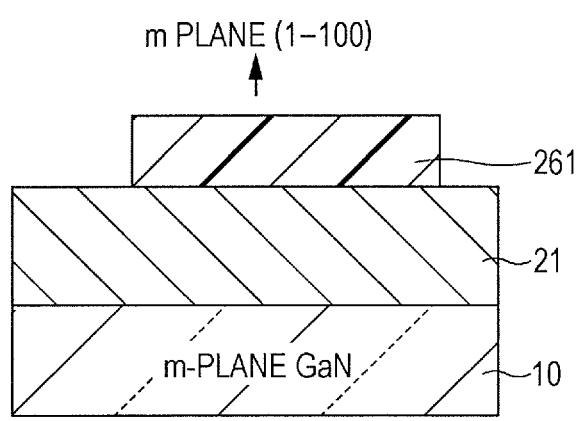

Next, as depicted in FIG. 19B, a resist pattern 261 is formed on the electron transit layer 21. In particular, after a photoresist is applied on the electron transit layer 21, exposure and development are performed using an exposure apparatus, so that the resist pattern 261 is formed. In addition, the resist pattern 261 is formed so that two surfaces of the electron transit layer 21 formed by removing parts thereof function as an N-polar surface and a Ga-polar surface.

Figure 19C:
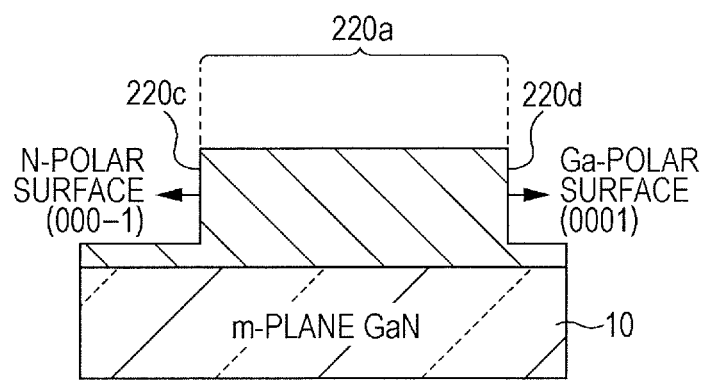

Next, as depicted in FIG. 19C, the electron transit layer 21 in a region in which the resist pattern 261 is not formed is partially removed by dry etching. By this etching, the electron transit layer 21 is partially removed, and by the side surfaces of the electron transit layer 21 exposed by the dry etching, the surface functioning as the first vertical interface 220c and the surface functioning as the second vertical interface 220d are formed. The surface functioning as the first vertical interface 220c is, for example, an N-polar surface (000-1), and the surface functioning as the second vertical interface 220d is a Ga-polar surface (0001). In addition, the first vertical interface 220c is formed at the side at which the source electrode 42, which will be described later, is formed, that is, between the source electrode 42 and the hole extraction electrode 44 or in a region right under the source electrode 42, and the second vertical interface 220d is formed right under the drain electrode 43 which will be described later. Subsequently, by using an organic alkali, such as a tetramethyl ammonium hydride (TMAH) solution, a surface treatment is performed, and at the same time, the resist pattern 261 is removed.

Figure 20A:
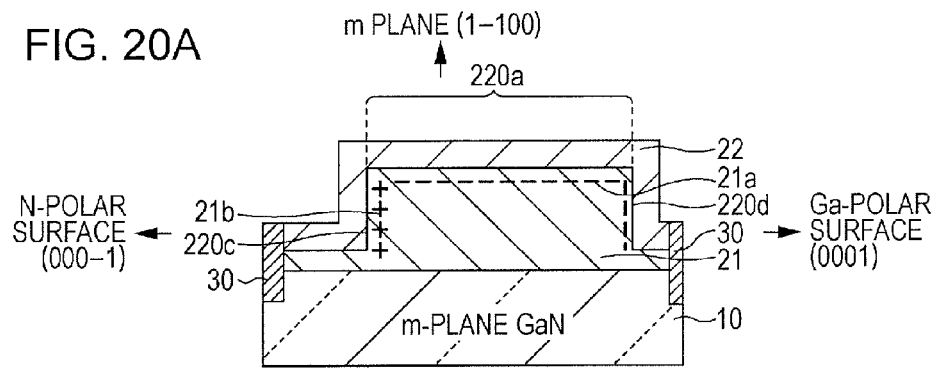
FIGS. 20A to 20C depict a process (2) of the method for manufacturing the semiconductor device according to the third embodiment.

Next, as depicted in FIG. 20A, the electron supply layer 22 is formed on the electron transit layer 21. In particular, an AlGaN layer functioning as the electron supply layer 22 is formed by epitaxial growth using PAMBE to have a thickness of 25 nm. When the electron supply layer 22 formed in this case is represented by $Al_xGa_{1-x}N$, x indicates 0.15 to 0.25. When the electron supply layer 22 is formed by PAMBE, Al, Ga, and ammonia are used as raw materials, and as an n-type impurity element, Si is doped so as to have a concentration of approximately $5 \times 10^{18}$ cm$^{-3}$. Accordingly, in the region 220a in which the electron transit layer 21 is not removed by dry etching, the 2DEG 21a is generated in the electron transit layer 21 in the vicinity of the interface between the electron transit layer 21 and the electron supply layer 22. In addition, in the electron transit layer 21 in the vicinity of the first vertical interface 220c formed by the side surface of the electron transit layer 21 formed by dry etching, the 2DHG 21b is generated. Furthermore, in the electron transit layer 21 in the vicinity of the second vertical interface 220d functioning as the side surface of the electron transit layer 21 formed by dry etching, the 2DEG 21a is generated. The concentration of electrons in the 2DEG 21a generated in the electron transit layer 21 in the vicinity of this second vertical interface 220d is higher than the concentration of electrons of the 2DEG 21a generated in the other portions of the electron transit layer 21.

Figure 20B:
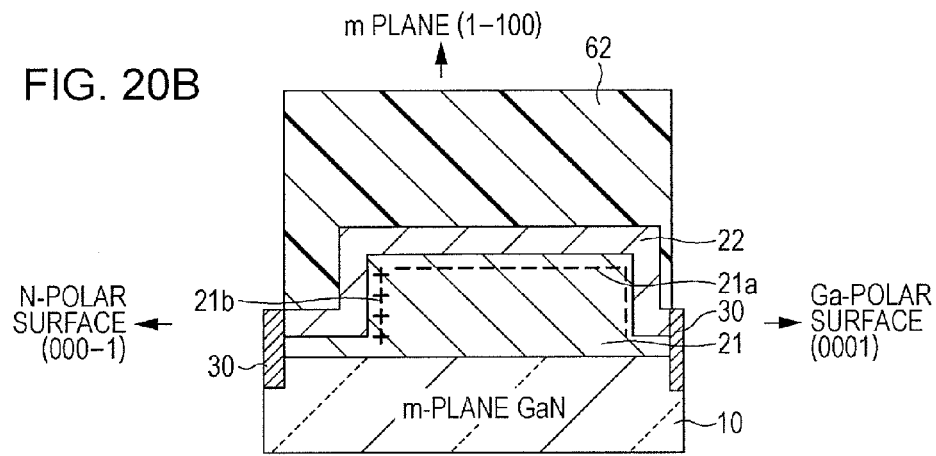

Next, as depicted in FIG. 20B, the element isolation region 30 is formed. In particular, after a photoresist is applied on the electron supply layer 22, exposure and development are performed using an exposure apparatus, so that the resist pattern 62 is formed in a region other than the region in which the element isolation region 30 is to be formed. Subsequently, in the region in which the resist pattern 62 is not formed, the element isolation region 30 is formed by performing ion-implantation of ions of boron, argon, or the like. In addition, the element isolation region 30 may be formed to have a mesa structure by dry etching using a chlorine-based etching gas. Subsequently, the resist pattern 62 is removed by an organic solvent or the like.

Figure 20C:
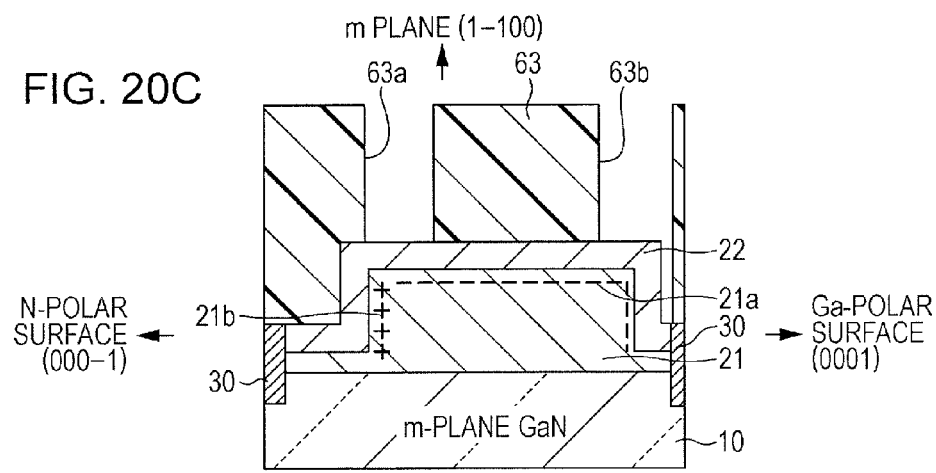

Next, as depicted in FIG. 20C, in a region in which the source electrode 42 and the drain electrode 43 are to be formed, the resist pattern 63 having the openings 63a and 63b is formed. In particular, after a photoresist is applied on the electron supply layer 22, exposure and development are performed using an exposure apparatus, so that the resist pattern 63 having the openings 63a and 63b is formed in the region in which the source electrode 42 and the drain electrode 43 are to be formed.

Figure 21A:
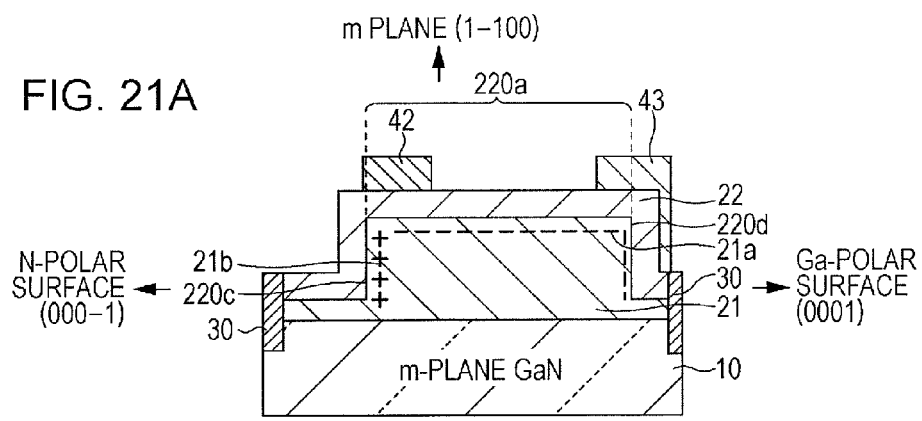
FIGS. 21A to 21C depict a process (3) of the method for manufacturing the semiconductor device according to the third embodiment.

Next, as depicted in FIG. 21A, the source electrode 42 and the drain electrode 43 are formed. In particular, after a metal film containing Ti and Al laminated to each other is formed by vacuum deposition or the like on the surface on which the resist pattern 63 is formed and is then immersed in an organic solvent or the like, a metal film on the resist pattern 63 is removed together with the resist pattern 63 by lift-off. Accordingly, metal films formed in the openings 63a and 63b of the resist pattern 63 are allowed to remain, so that the source electrode 42 and the drain electrode 43 are formed on the electron supply layer 22. As described above, on the electron supply layer 22 in the region 220a, the source electrode 42 is formed, and the drain electrode 43 is formed on the second vertical interface 220d with the electron supply layer 22 interposed therebetween. Subsequently, by performing rapid thermal annealing (RTA) at a temperature of 600° C., the source electrode 42 and the drain electrode 43 are each ohmic-contacted.

Figure 21B:
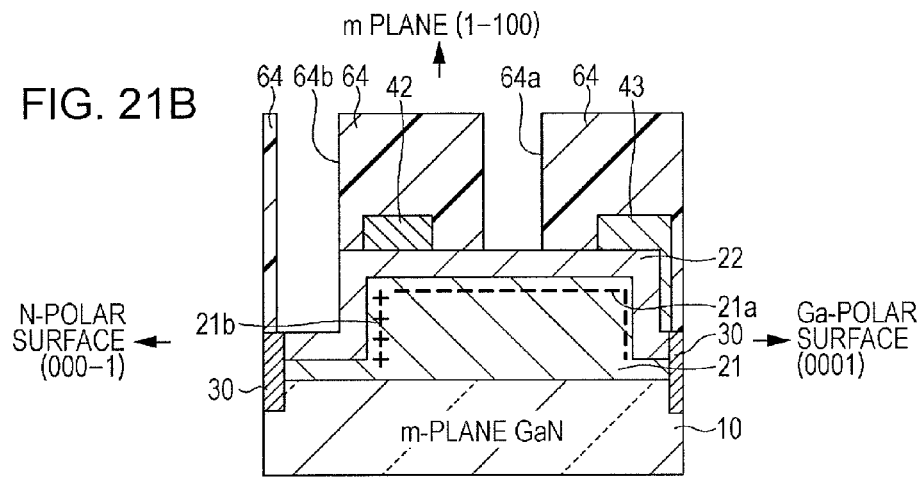

Next, as depicted in FIG. 21B, the resist pattern 64 having the openings 64a and 64b is formed in a region in which the gate electrode 41 and the hole extraction electrode 44 are to be formed. In particular, after a photoresist is applied on the electron supply layer 22, exposure and development are performed using an exposure apparatus, so that the resist pattern 64 having the openings 64a and 64b is formed in the region in which the gate electrode 41 and the hole extraction electrode 44 are to be formed.

Figure 21C:
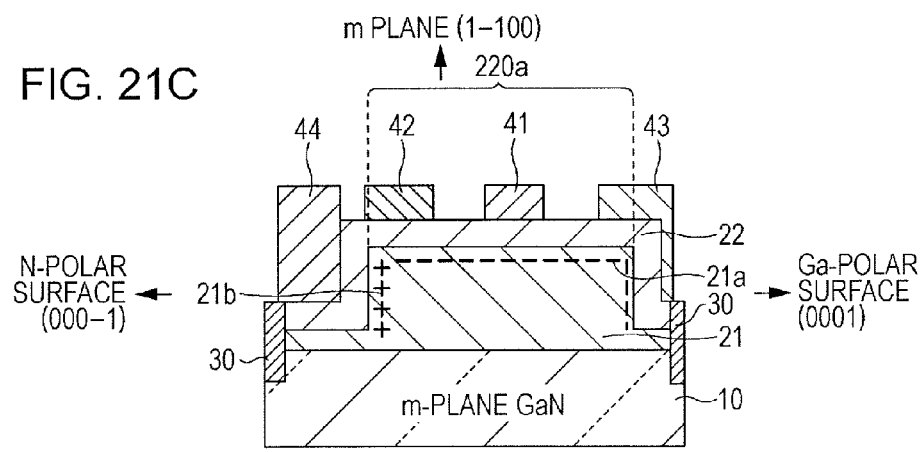

Next, as depicted in FIG. 21C, the gate electrode 41 and the hole extraction electrode 44 are formed. In particular, after a metal film containing Ni and Au laminated to each other is formed by vacuum deposition or the like on the surface on which the resist pattern 64 is formed and is then immersed in an organic solvent or the like, a metal film on the resist pattern 64 is removed together with the resist pattern 64 by lift-off. Accordingly, metal films formed in the openings 64a and 64b of the resist pattern 64 are allowed to remain, so that the gate electrode 41 and the hole extraction electrode 44 are formed on the electron supply layer 22. The gate electrode 41 described above is formed on the electron supply layer 22 in the region 220a, and the hole extraction electrode 44 is formed at the side surface of the electron transit layer 21 functioning as the first vertical interface 220c with the electron supply layer 22 interposed therebetween. In addition, since having a relatively high work function, Ni forms a Schottky barrier at the Ga-polar surface and has ohmic characteristics at the N-polar surface. In addition, in order to improve the ohmic characteristics, annealing may be performed at a temperature of 400° C. for 5 minutes.

Subsequently, as in the case of the first embodiment, the insulating layer 50 may also be formed for passivation. In addition, members, methods, and the like other than those described above are similar to those of the first embodiment.

Fourth Embodiment

Semiconductor Device

Figure 22:
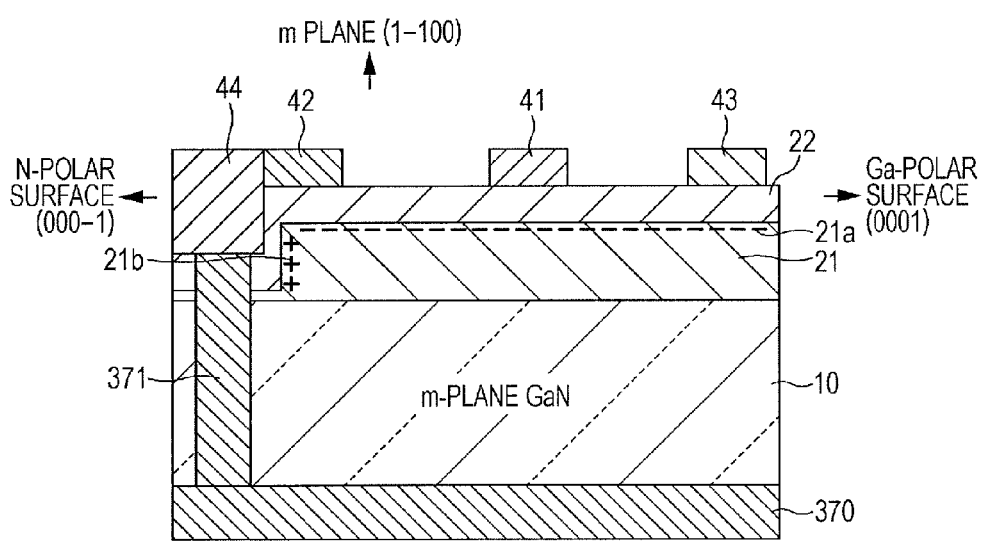
FIG. 22 is a cross-sectional structural view of a semiconductor device according to a fourth embodiment.

Next, a fourth embodiment will be described with reference to FIG. 22. A semiconductor device of this embodiment has the structure in which in the semiconductor device of the first embodiment, a backside-surface electrode 370 is formed on a backside surface of the substrate 10, and the backside-surface electrode 370 is electrically connected to the hole extraction electrode 44 with a through electrode 371 penetrating through the substrate 10 and the like. In this embodiment, by the structure as described above, the source inductance can be reduced, and in addition, holes extracted by the hole extraction electrode 44 can be efficiently discharged to the ground through the backside-surface electrode 370, so that high-frequency characteristics can be improved.

Method for Manufacturing Semiconductor Device

Next, a method for manufacturing the semiconductor device according to this embodiment will be described. Since the semiconductor device of this embodiment is manufactured by processing the semiconductor device of the first embodiment, the method of this embodiment will be described with reference to the semiconductor device depicted in FIG. 11.

Figure 23A:
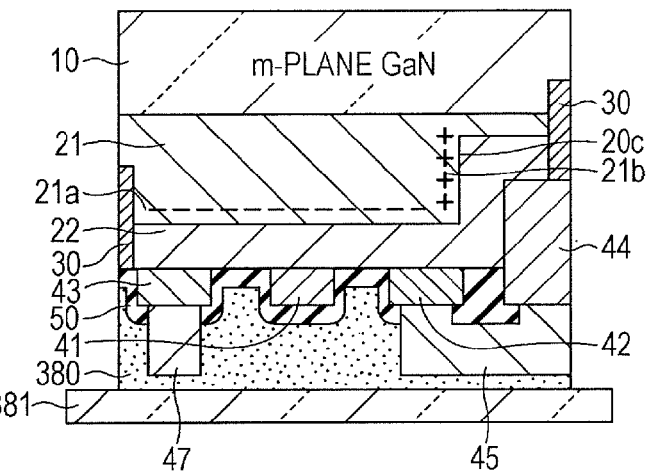
FIGS. 23A to 23C depict a process (1) of a method for manufacturing the semiconductor device according to the fourth embodiment.

First, as depicted in FIG. 23A, with a thermoplastic adhesive 380, a support substrate 381 is adhered to the side of the semiconductor device depicted in FIG. 11 at which the gate electrode 41, the source electrode 42, and the drain electrode 43 are formed. Subsequently, the backside surface of the substrate 10 is polished to have a thickness of 100 μm.

In addition, the support substrate 381 is formed, for example, of a sapphire substrate.

Figure 23B:
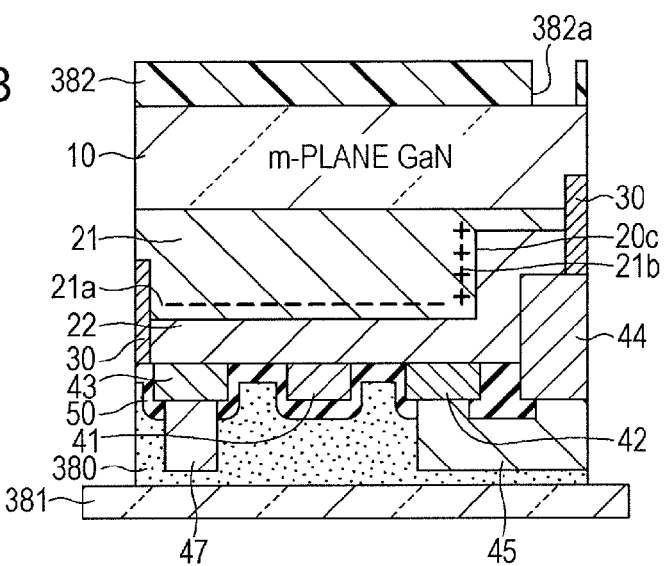

Next, as depicted in FIG. 23B, a mask 382 of a metal is formed on the backside surface of the substrate 10. The mask 382 is formed of Ni and has an opening 382a in a region in which a via hole 383, which will be described later, is to be formed. The mask 382 may be formed in such a way that after a resist pattern of a photoresist or the like is formed in a region in which the opening 382a is to be formed, nonelectrolytic Ni plating is performed. Alternatively, the mask 382 may also be formed in such a way that after seed metal sputtering is performed, and a resist pattern of a photoresist or the like is then formed in the region in which the opening 382a is to be formed, electrolytic Ni plating is performed, and a seed metal is then removed by ion milling or the like.

Figure 23C:
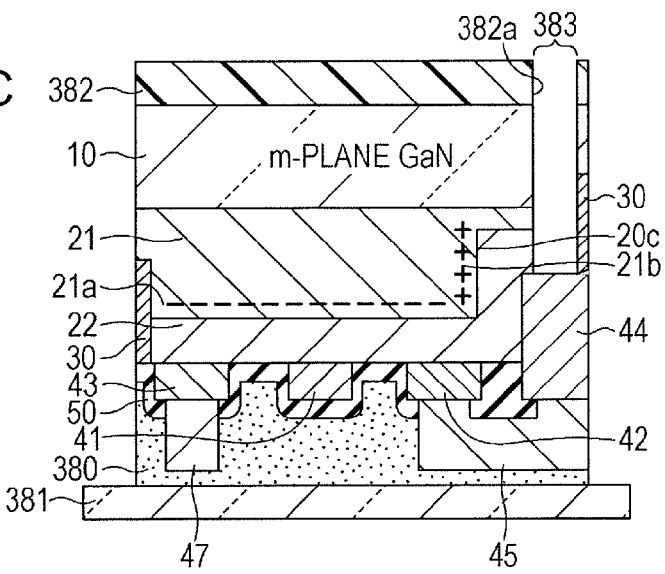

Next, as depicted in FIG. 23C, the substrate 10, the electron transit layer 21, and the electron supply layer 22 located at a position corresponding to the opening 382a of the mask 382 are removed by dry etching, so that the hole extraction electrode 44 is exposed. Accordingly, the via hole 383 is formed. In addition, in this dry etching, a chlorine-containing gas is used as an etching gas.

Figure 24A:
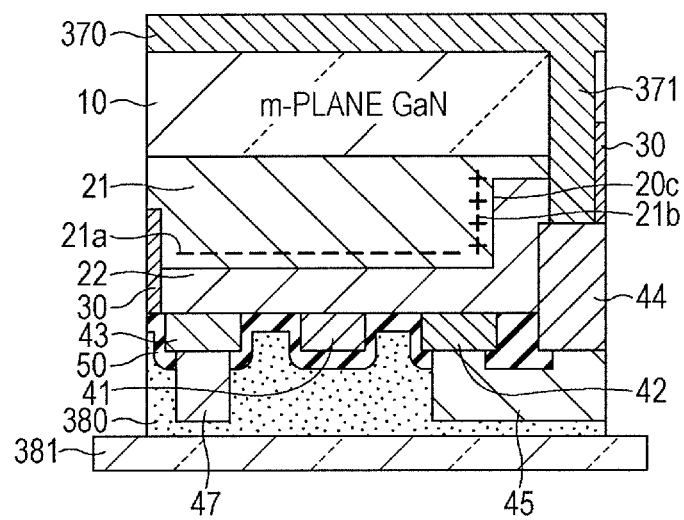
FIGS. 24A and 24B depict a process (2) of the method for manufacturing the semiconductor device according to the fourth embodiment.

Next, as depicted in FIG. 24A, by performing nonelectrolytic Au plating or by performing seed metal plating and electrolytic Au plating, the inside of the via hole 383 is filled with Au or the like to form the embedded through electrode 371. Furthermore, by continuously performing nonelectrolytic Au plating or electrolytic Au plating, the backside-surface electrode 370 is formed on the backside surface of the substrate 10.

Figure 24B:
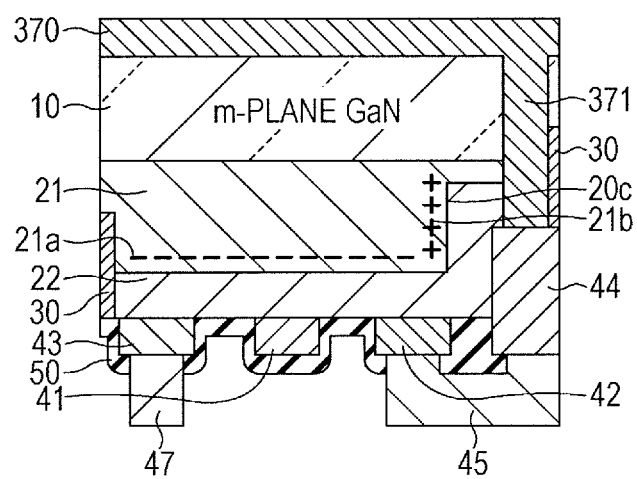

Next, as depicted in FIG. 24B, the support substrate 381 is peeled off by applying heat, and the adhered adhesive 380 is removed by cleaning or the like. Accordingly, the semiconductor device of this embodiment can be formed.

In addition, when the substrate 10 includes a SiC substrate, an AlN substrate, or the like, by a method similar to that described above, the via hole 383 may be formed by dry etching. In addition, when the substrate 10 includes a sapphire substrate or the like, since sapphire is very hard and has excellent resistance against a chemical substance, such as an acid, the via hole 383 may be formed by using a high output laser drill or the like.

In addition, this embodiment may also be applied to the semiconductor devices of the second and the third embodiments. In addition, members, methods, and the like other than those described above are similar to those of the first embodiment.

Fifth Embodiment

Next, a fifth embodiment will be described. This embodiment relates to a semiconductor device, a power supply device, and a high frequency amplifier.

Figure 25:
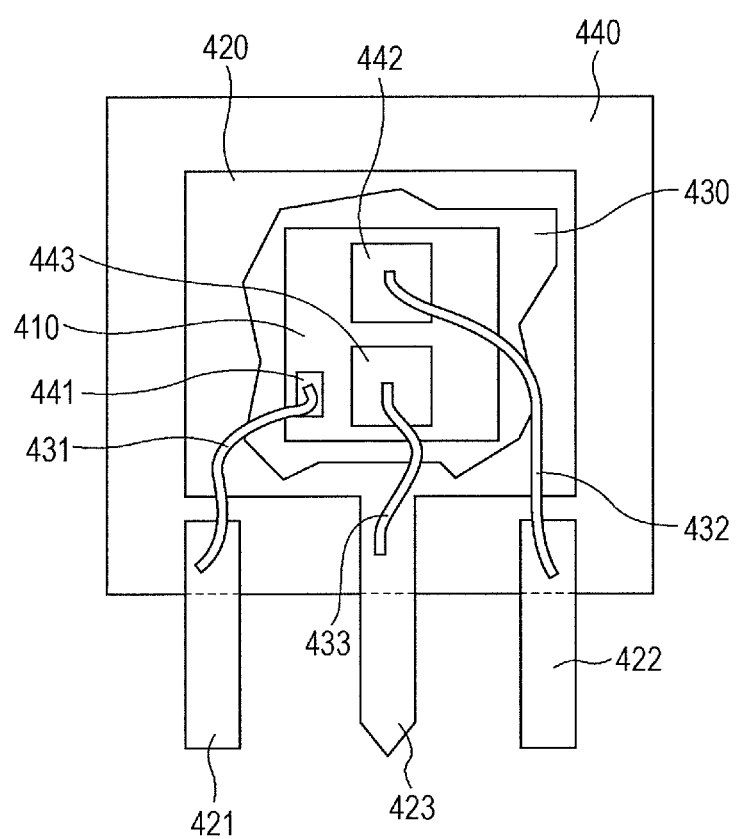
FIG. 25 is a schematic view illustrating a discrete-packaged semiconductor device according to a fifth embodiment.

A semiconductor device of this embodiment is a discrete-packaged device formed from the semiconductor device of one of the first to the fourth embodiments. The discrete-packaged semiconductor device as described above will be illustrated with reference to FIG. 25. FIG. 25 is a schematic view illustrating the inside of the discrete-packaged semiconductor device, and the arrangements of the electrodes and the like are different from those described in the first to the fourth embodiments.

First, the semiconductor device manufactured in one of the first to the fourth embodiments is cut by dicing or the like to form a HEMT semiconductor chip 410 using a GaN-based semiconductor material. This semiconductor chip 410 is fixed on a lead frame 420 with a die attach agent 430 such as solder. This semiconductor chip 410 corresponds to the semiconductor device of one of the first to the fourth embodiments.

Next, a gate electrode 441 is connected to a gate lead 421 with a bonding wire 431, a source electrode 442 is connected to a source lead 422 with a bonding wire 432, and a drain electrode 443 is connected to a drain lead 423 with a bonding wire 433. The bonding wires 431, 432, and 433 are each formed from a metal material, such as Al. In addition, in this embodiment, the gate electrode 441 is a gate electrode pad and is connected to the gate electrode 41 of the semiconductor device of one of the first to the fourth embodiments. In addition, the source electrode 442 is a source electrode pad and is connected to the source electrode 42 of the semiconductor device of one of the first to the fourth embodiments. Furthermore, the drain electrode 443 is a drain electrode pad and is connected to the drain electrode 43 of the semiconductor device of one of the first to the fourth embodiments.

Next, by a transfer molding method, resin encapsulation is performed using a mold resin 440. As described above, a discrete-packaged HEMT semiconductor device using a GaN-based semiconductor material can be formed.

Next, a power supply device and a high frequency amplifier of this embodiment will be described. The power supply device and the high frequency amplifier of this embodiment are a power supply device and a high frequency amplifier, respectively, each using the semiconductor device of one of the first to the fourth embodiments.

Figure 26:
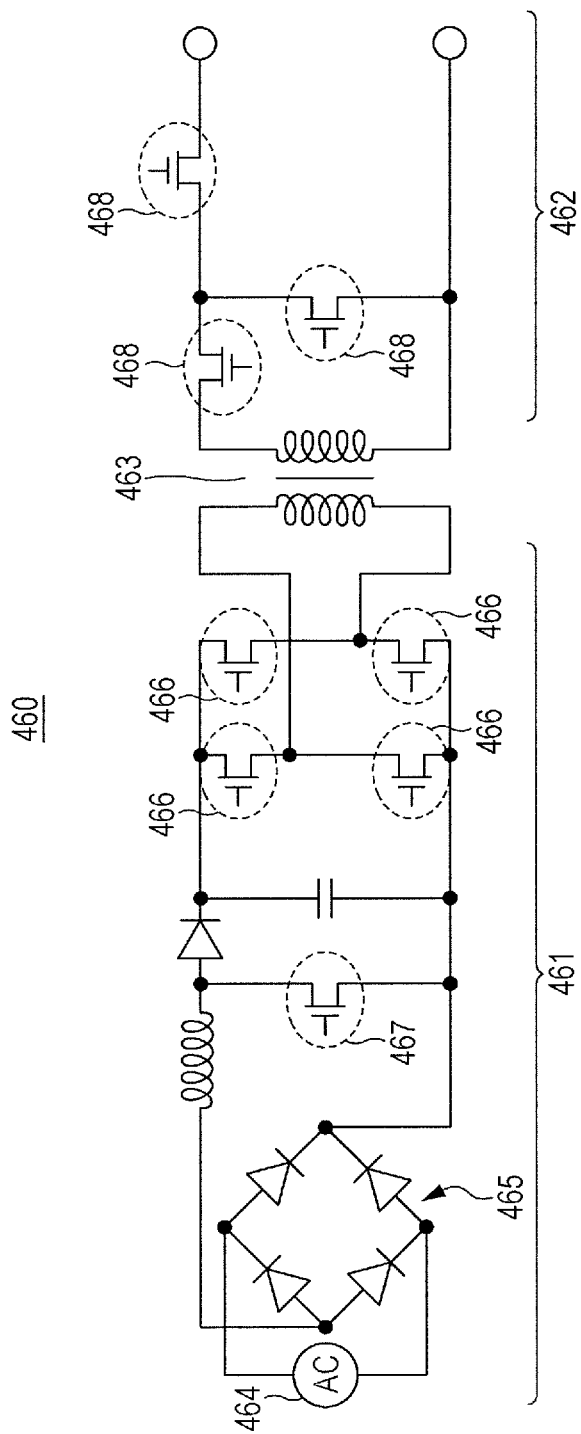
FIG. 26 is a circuit diagram of a power supply device according to the fifth embodiment.

First, with reference to FIG. 26, the power supply device of this embodiment will be described. A power supply device 460 of this embodiment has a high-voltage primary-side circuit 461, a low-voltage secondary-side circuit 462, and a transformer 463 disposed between the primary-side circuit 461 and the secondary-side circuit 462. The primary-side circuit 461 has an alternating-current power supply 464, a so-called bridge rectifier circuit 465, switching elements (4 elements in the example depicted in FIG. 26) 466, a switching element 467, and the like. The secondary-side circuit 462 has switching elements (3 elements in the example depicted in FIG. 26) 468. In the example depicted in FIG. 26, the semiconductor devices of the first to the fourth embodiments are used as the switching elements 466 and 467 of the primary-side circuit 461. In addition, the switching elements 466 and 467 of the primary-side circuit 461 are each preferably a normally-off semiconductor device. In addition, as the switching element 468 used in the secondary-side circuit 462, a common metal insulator semiconductor field effect transistor (MISFET) is used.

Figure 27:
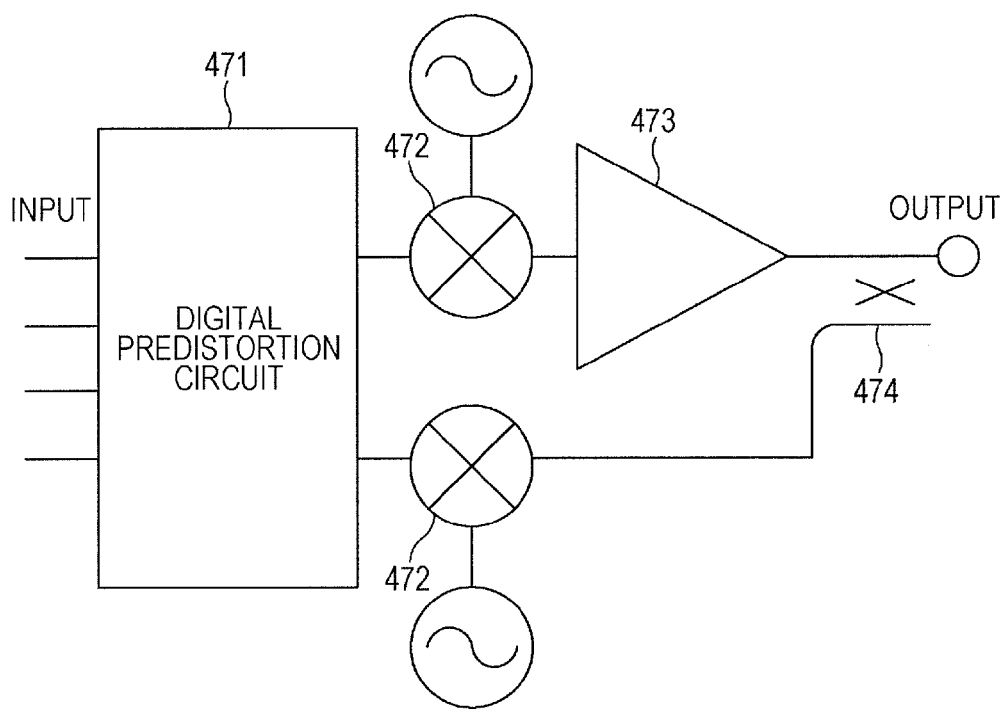
FIG. 27 is a schematic structural view of a high output amplifier according to the fifth embodiment.

Next, with reference to FIG. 27, the high frequency amplifier of this embodiment will be described. A high frequency amplifier 470 of this embodiment may be applied, for example, to a power amplifier of a base station of mobile phones. This high frequency amplifier 470 has a digital predistortion circuit 471, mixers 472, a power amplifier 473, and a directional coupler 474. The digital predistortion circuit 471 compensates for non-linear strains of input signals. The mixers 472 each mix the input signals, the non-linear strains of which are compensated for, with alternating-current signals. The power amplifier 473 amplifies the input signals which are mixed with the alternating-current signals. In the example depicted in FIG. 27, the power amplifier 473 has the semiconductor device according to one of the first to the fourth embodiments. The directional coupler 474 performs, for example, monitoring of input signals and output signals. In the circuit depicted in FIG. 27, for example, by switching a switch, output signals may be mixed with alternating-current signals by the mixers 472 so as to be sent to the digital predistortion circuit 471.

Heretofore, although the embodiments have been described in detail, the embodiments are not limited to a specific embodiment and may be changed and modified without departing from the scope described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first semiconductor layer of a nitride semiconductor formed on a substrate;
   a first recess portion formed on a surface of the first semiconductor layer in a first region of the semiconductor device;
   a second semiconductor layer of a nitride semiconductor formed on a bottom and a side surface of the first recess portion and on the surface of the first semiconductor layer in a second region of the semiconductor device; and
   a second recess portion formed on a surface of the second semiconductor layer in the first region of the semiconductor device;
   a hole extraction electrode formed in the second recess portion and on the second semiconductor layer in the first region of the semiconductor device;
   a gate electrode, a source electrode and a drain electrode formed on the second semiconductor layer in the second region of the semiconductor device,
   wherein the side surface of the first recess portion configured to form a vertical interface, the vertical interface of the first semiconductor layer includes N atoms at the surface referred to as an N-polar surface.

2. The semiconductor device according to claim 1,
   wherein the vertical interface of the first semiconductor layer is formed by removing a part of the first semiconductor layer,
   the gate electrode, the source electrode, and the drain electrode are formed in a region in which the first semiconductor layer is not removed, and
   the hole extraction electrode is formed in a region in which the part of the first semiconductor layer is removed.

3. The semiconductor device according to claim 1, wherein
   the surface of the first semiconductor layer parallel to the surface of the substrate is a non-polar surface.

4. The semiconductor device according to claim 1, wherein
   a surface of the substrate is an a-plane or an m-plane of crystal plane orientation.

5. The semiconductor device according to claim 1, wherein
   a surface of the substrate is perpendicular to a c-plane of crystal plane orientation and is located between an m-plane and an a-plane of crystal plane orientation.

6. The semiconductor device according to claim 1, wherein
   the substrate is one of
   an m-plane AlN substrate,
   an m-plane SiC substrate,
   a γ-LiAlO$_2$ (100) substrate,
   an m-plane ZnO substrate,
   an m-plane sapphire substrate,
   an a-plane sapphire substrate having a patterned surface,
   a Si (112) substrate having a patterned surface,
   an a-plane GaN substrate,
   an a-plane AlN substrate,
   an a-plane ZnO substrate,
   an a-plane SiC substrate,
   an r-plane sapphire substrate, and
   a LiGaO$_2$ (010) substrate.

7. The semiconductor device according to claim 1, wherein
   the substrate is a substrate having a surface on which a film of m-plane AlN, m-plane SiC, γ-LiAlO$_2$ (100), m-plane ZnO, m-plane sapphire, a-plane sapphire having a patterned surface, Si (112) having a patterned surface, a-plane GaN, a-plane AlN, a-plane ZnO, a-plane SiC, r-plane sapphire, or LiGaO$_2$ (010) is formed.

8. The semiconductor device according to claim 1,
   wherein the second semiconductor layer is a first conductive type semiconductor layer.

9. The semiconductor device according to claim 8,
   wherein the first conductive type indicates an n-type conductivity.

10. The semiconductor device according to claim 1,
    further comprising a second conductive type semiconductor layer between the second semiconductor layer and the gate electrode.

11. The semiconductor device according to claim 1,
    further comprising a second conductive type semiconductor layer between the second semiconductor layer and the hole extraction electrode.

12. The semiconductor device according to claim 10,
    wherein the second conductive type indicates a p-type conductivity.

13. The semiconductor device according to claim 1,
    wherein the vertical interface is a first vertical interface,
    the first semiconductor layer and the second semiconductor layer form a second vertical interface right under the drain electrode so as to be approximately perpendicular to the surface of the substrate, and
    a surface of the first semiconductor layer configured to form the second vertical interface is a Ga-polar surface.

14. The semiconductor device according to claim 1,
    wherein the vertical interface is a first vertical interface,
    the first semiconductor layer and the second semiconductor layer form a second vertical interface right under the drain electrode so as to be approximately perpendicular to the surface of the substrate, and
    a surface of the first semiconductor layer configured to form the second vertical interface is along the (0001) plane.

15. The semiconductor device according to claim 1,
    wherein the hole extraction electrode is grounded.

16. The semiconductor device according to to claim 1,
    further comprising a backside-surface electrode on a backside surface of the substrate, wherein the hole extraction electrode and the backside-surface electrode are electrically connected to each other with a through electrode configured to penetrate through the substrate.

17. The semiconductor device according to claim 1, wherein the first semiconductor layer includes a material containing GaN.

18. A semiconductor device comprising:

a first semiconductor layer of a nitride semiconductor formed on a substrate;

a first recess portion formed on a surface of the first semiconductor layer in a first region of the semiconductor device;

a second semiconductor layer of a nitride semiconductor formed on a bottom and a side surface of the first recess portion and on the surface of the first semiconductor layer in a second region of the semiconductor device; and a second recess portion formed on a surface of the second semiconductor layer in the first region of the semiconductor device;

a hole extraction electrode formed in the second recess portion and on the second semiconductor layer in the first region of the semiconductor device;

a gate electrode, a source electrode and a drain electrode formed on the second semiconductor layer in the second region of the semiconductor device, wherein the vertical interface of the first semiconductor layer having a (000-1) plane of crystal plane orientation.

* * * * *